US008299836B2

(12) United States Patent
Sakurai et al.

(10) Patent No.: US 8,299,836 B2
(45) Date of Patent: Oct. 30, 2012

(54) LEVEL SHIFT CIRCUIT AND POWER CONVERSION UNIT

(75) Inventors: Naoki Sakurai, Hitachi (JP); Junichi Sakano, Hitachi (JP); Seigoh Yukutake, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 14 days.

(21) Appl. No.: 13/029,341

(22) Filed: Feb. 17, 2011

(65) Prior Publication Data

US 2011/0227626 A1    Sep. 22, 2011

(30) Foreign Application Priority Data

Mar. 17, 2010   (JP) ................................. 2010-060169

(51) Int. Cl.
*H03L 5/00*      (2006.01)
(52) U.S. Cl. ........................ 327/333; 327/108
(58) Field of Classification Search .................. None
See application file for complete search history.

(56) References Cited

U.S. PATENT DOCUMENTS

| | | | | |
|---|---|---|---|---|
| 5,917,359 | A * | 6/1999 | Fukunaga et al. ............ | 327/381 |
| 6,326,831 | B1 * | 12/2001 | Kumagai ...................... | 327/333 |
| 6,529,061 | B1 * | 3/2003 | Orita ............................. | 327/381 |
| 6,531,894 | B2 * | 3/2003 | Watabe ......................... | 326/82 |
| 6,734,706 | B2 * | 5/2004 | Yoshida et al. ............... | 327/108 |
| 7,049,850 | B2 * | 5/2006 | Shimizu ........................ | 326/100 |
| 7,495,482 | B2 * | 2/2009 | Sakai et al. ................... | 327/108 |
| 7,595,667 | B2 * | 9/2009 | Liang ............................. | 327/108 |
| 7,764,089 | B2 * | 7/2010 | Iwabuchi et al. ............. | 327/108 |

FOREIGN PATENT DOCUMENTS

| | | |
|---|---|---|
| GB | 2244400 | 11/1991 |
| JP | 3092862 | 9/2000 |
| JP | 3635975 | 4/2005 |

* cited by examiner

*Primary Examiner* — Tuan T Lam
(74) *Attorney, Agent, or Firm* — Antonelli, Terry, Stout & Kraus, LLP.

(57) ABSTRACT

In a level shift circuit, when a power-source voltage variation dV/dt of a high voltage side occurs and influences on a logic level of a circuit, the passing through of a malfunction signal is masked and prevented in the first and second logic circuits, by a signal from a time-constant generation circuit or a portion where a power voltage variation occurs in advance, by utilizing the fact that this variation occurs both at a set side and a reset side. When the power source voltage variation dV/dt is generated at a high voltage side, sufficient allowance in the timing of this masking prevents an erroneous signal from being transmitted to a flip-flop, and a control signal is transmitted from a low voltage side circuit not giving malfunction to a high voltage side circuit, even when there is a production variation in each element in semiconductor processes.

9 Claims, 14 Drawing Sheets

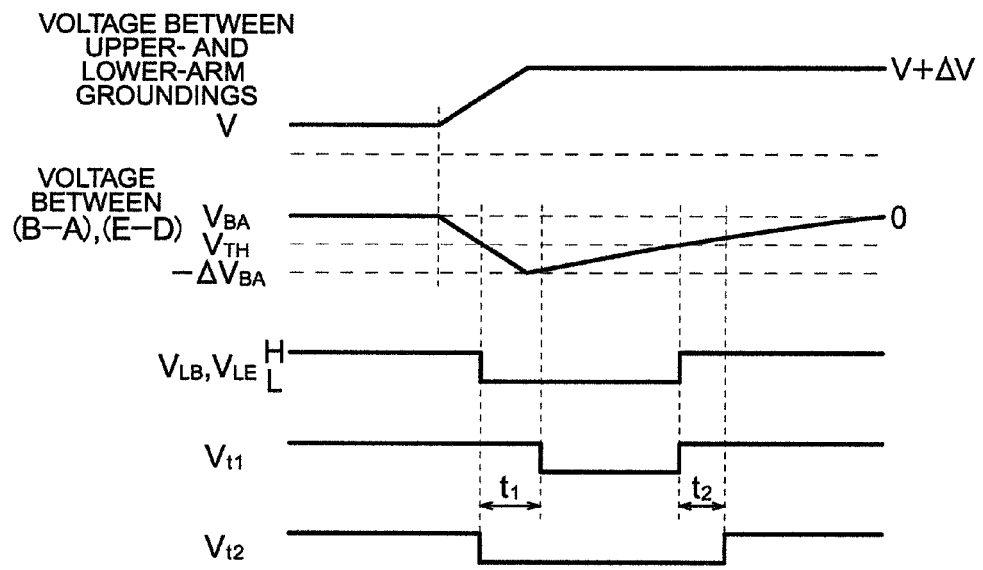
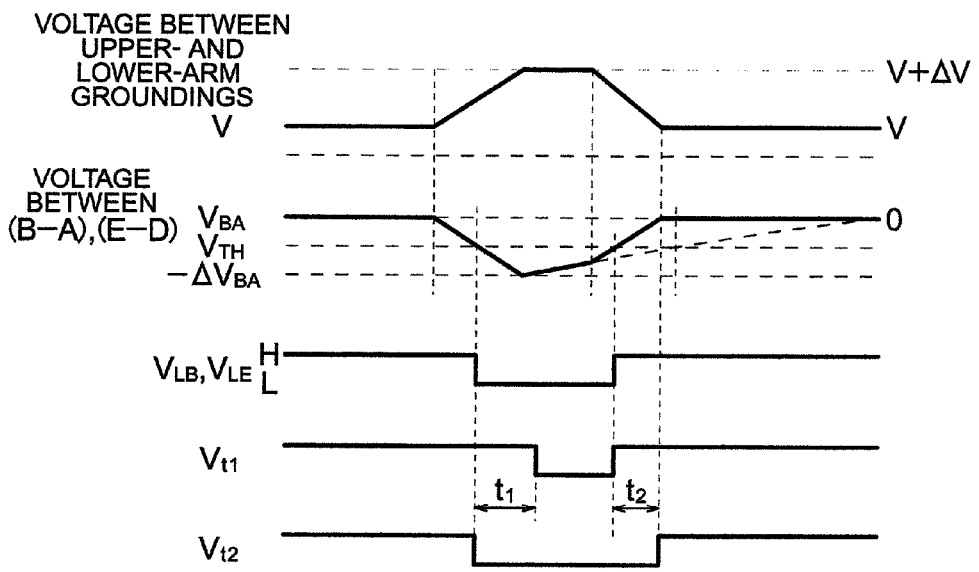

LEVEL SHIFT CIRCUIT AND POWER CONVERSION UNIT

BACKGROUND OF THE INVENTION

The present invention relates to a motor driving unit provided with at least one pair of arms composed of first and second power switching elements connected in series between main terminals, in particular the present invention relates to a level shift circuit for transmitting a control signal from a low voltage side circuit to a high voltage side circuit, and a power conversion unit having the level shift circuit function.

For energy saving, control of a motor by a semiconductor element such as an IGBT (Insulated Gate Bipolar transistor) has widely been utilized in recent years, by virtue of price reduction of the semiconductor element, in particular, the IGBT.

Incidentally, in the power conversion unit provided with an upper-arm and a lower-arm, because an emitter of the IGBT used in the composing upper-arm is connected to an output, the upper-arm IGBT is driven under a potentially floating state, to a grounding terminal of a main power source. For example, when the upper-arm IGBT is in an ON state, the same high voltage as the main power source is applied. Therefore, to drive the upper-arm IGBT, it is necessary to transmit a signal from low potential to high-potential of a microcomputer which is a control circuit. It is described in JP-3092862 shown in FIG. 15 to use the level shift circuit as a method for sending a drive signal to the potentially floating upper-arm, by the signal from low potential in this way.

Explanation will be given briefly on the operation of the level shift circuit of JP-3092862, with reference to FIG. 15. In FIG. 15, (a), the level shift circuit is composed of two high-voltage n-type MOSFETs (Metal-Oxide-Semiconductor Field-Effect Transistor, Insulated Gate Field-Effect Transistor) for setting and resetting, two one-shot pulse generators for driving this high-voltage n-type MOSFET, two resistances, a pulse filter and an RS flip-flop. A drain of the high-voltage n-type MOSFET for setting is connected to the resistance and is inputted to the set side of the RS flip-flop through the pulse filter. A drain of the high-voltage n-type MOSFET for resetting is connected to the resistance for resetting and is inputted to the reset side of the RS flip-flop through the pulse filter.

This level shift circuit operates as follows. For the input signal, a pulse is generated from the one-shot pulse generator of the set side for a short period, in rising (input="L"→"H") (FIG. 15, (b)). It should be noted that "L" means a low, negative or zero signal. In addition, "H" means a high, positive or 1 signal.

By this pulse, the high-voltage n-type MOSFET of the set side is made ON, and flow of an electric current generates voltage between both ends of the resistance of the set side. By making a time of a pulse generated in the one-shot pulse generator longer than time-constant of the pulse filter, the pulse caused by the voltage generated between the both ends of the resistance passes through the pulse filter, and makes the output ON by setting the RS flip-flop. In falling (input="H"→"L"), a pulse is generated from the one-shot pulse generator of the reset side for a short period (FIG. 15, (b)), and voltage is generated between both ends of the resistance of the reset side, and makes the output OFF by resetting the RS flip-flop.

In the case where signal transmission is carried out by single high-voltage n-type MOSFET, in a state that the upper-arm is ON, the high-voltage n-type MOSFET is required to be ON under a state that high voltage is applied, which generates very large loss. By splitting the input signal to two signals of setting and resetting, and by demodulation at the RS flip-flop, a time for making the high-voltage n-type MOSFET ON is made short to reduce the loss.

In addition, in JP-3635975, as means for solving the aforesaid problem, a method for using a logic circuit is shown. Explanation will be given on outline of the operation, with reference to FIG. 16. A configuration of two high-voltage n-type MOSFETs for setting and resetting, two one-shot pulse generators that drive the two high-voltage n-type MOSFETs, and two resistances is the same as in FIG. 15. A drain of the high-voltage n-type MOSFET at the set side is inputted to an NAND circuit of the set side through an inverter circuit (NOT circuit, inverting circuit), and further inputted to the NAND circuit of the reset side. A drain of the high-voltage n-type MOSFET at the reset side is inputted to an NAND (non-conjunction) circuit of the reset side through an inverter circuit, and further inputted to the NAND circuit of the set side.

By this configuration, in usual operation, for example, in the case of setting, because a voltage drop is generated only at the resistance of the set side, it is inverted by the inverter circuit to become "H". Because a voltage drop is not generated at the reset side, it is "H" and a set signal is transmitted to the RS flip-flop. It should be noted that, when voltage variation of the power source (dV/dt, V→V+ΔV) is generated at the high voltage side power source, a voltage drop is generated at both of the set side and the reset side, therefore, for example, the NAND circuit of the set side becomes "H" at the side connected to the resistance of the set side and becomes "L" at the side connected to the reset side, and in this way an erroneous signal is not transmitted to the flip-flop and normal operation is maintained.

SUMMARY OF THE INVENTION

Incidentally, when the IGBT is turned ON and OFF, voltage between the upper and the lower-arm groundings changes. By this time change dV/dt of voltage (power source voltage), an electric current of (dV/dt)×Cds flows to a parasitic capacitance Cds between a source and a drain of the high-voltage n-type MOSFET of the level shift circuit, in the aforesaid power source voltage variation (dV/dt). By this electric current, a voltage is generated at the resistance of the level shift circuit, and when this voltage is large, erroneous ON or erroneous OFF is induced.

In the aforesaid JP-3092862, an erroneous signal induced by the power source voltage variation (dV/dt) is filtered by a pulse filter (FIG. 15, (a)). However, there was a problem that the voltage generated was different depending on a system, and thus suitable designing of a time-constant was difficult. That is, to set the time-constant of the filter longer requires to lengthen a period to make the high-voltage n-type MOSFET ON by the one-shot pulse generator, which increases loss. On the contrary, to set the time-constant of the filter too short provides a problem that the erroneous signal induced by the voltage variation (dV/dt) passes through the filter and induces erroneous ON or erroneous OFF.

In addition, in JP-3635975, in the power source voltage variation (dV/dt), charge accumulated in the parasitic capacitance Cds of the MOSFET flows through a resistance. In this case, flowing electric current decreases with time, but the larger this resistance is, the longer a time exceeding a threshold value of a logic circuit becomes. In addition, there is a production variation also in a semiconductor integrated circuit and values of set and reset resistances cannot be made the same. Therefore, for example, in the case where the set side has a larger resistance value caused by the production variation, a time when an output of an inverter circuit of the set side is "H" becomes longer than a time when the reset side is "L", which may possibly allow an NAND output of the set side to generate the erroneous signal and induce the erroneous ON (FIG. 16).

Accordingly, the present invention is one for solving such problems, and it is an object of the present invention to provide a level shift circuit that does not easily give a malfunction even on the power source voltage variation.

To solve the aforesaid problems and to attain the object of the present invention, the following configuration was taken.

That is, the present invention is a level shift circuit for transmitting a control signal from a low voltage side circuit having a low-voltage direct-current power source as a power source to a high voltage side circuit having a high-voltage direct-current power source as a power source, comprising; a one-shot pulse generator for generating a set signal pulse and a reset signal pulse in rising and in falling of an input signal, respectively, using the low-voltage direct-current power source as the power source; a first semiconductor switching element wherein the first terminal is connected to a low voltage terminal of the high-voltage direct-current power source and the set signal pulse is input; a second semiconductor switching element wherein the first terminal is connected to a low voltage terminal of the high-voltage direct-current power source and the reset signal pulse is input; a first resistance connected between the high voltage terminal of the high-voltage direct-current power source and a second terminal of the first semiconductor switching element; a second resistance connected between the high voltage terminal of the high-voltage direct-current power source and a second terminal of the second semiconductor switching element; a first time-constant generation circuit wherein a connection point of the second terminal of the first semiconductor switching element and the first resistance is connected to an input terminal; a second time-constant generation circuit wherein a connection point of the second terminal of the second semiconductor switching element and the second resistance is connected to an input terminal; a third time-constant generation circuit wherein a connection point of the second terminal of the second semiconductor switching element and the second resistance is connected to an input terminal; a fourth time-constant generation circuit wherein a connection point of the second terminal of the first semiconductor switching element and the first resistance is connected to an input terminal; a first logic circuit wherein, using the high-voltage direct-current power source as a power source, the output terminal of the first time-constant generation circuit and the output terminal of the second time-constant generation circuit are connected to the first input terminal and the second input terminal, respectively, and the set signal is output; a second logic circuit wherein, using the high-voltage direct-current power source as a power source, the output terminal of the third time-constant generation circuit and the output terminal of the fourth time-constant generation circuit are connected to the first input terminal and the second input terminal, respectively, and the reset signal is output; and a flip-flop circuit wherein, using the high-voltage direct-current power source as a power source, the set signal of the output of first logic circuit and the reset signal of the output of the second logic circuit are input, respectively, and a drive signal is output.

By such a configuration, in the level shift circuit, when the power source voltage variation (dV/dt) is generated at the high voltage side, influence of this voltage variation is theoretically treated using the first (second) logic circuit through the first (third) time-constant generation circuit and the second (fourth) time-constant generation circuit, so that the erroneous signal induced by the power source voltage variation (dV/dt) can be mask treated, and the malfunction can be prevented.

In this way, according to the present invention, even in variation of power source voltage, a level shift circuit that does not easily induce the malfunction, can be provided.

Other objects, features and advantages of the invention will become apparent from the following description of the embodiments of the invention taken in conjunction with the accompanying drawings.

BRIEF DESCRIPTION OF THE DRAWINGS

FIG. 4A is a time chart representing an operation of the time-constant generation circuit, when there is a power source voltage variation of the first example in the first embodiment of the level shift circuit of the present invention.

FIG. 4B is a time chart representing the operation of the time-constant generation circuit, when there is a power source voltage variation of a second example in the first embodiment of the level shift circuit of the present invention.

DETAILED DESCRIPTION OF THE EMBODIMENTS

Explanation will be given below on the embodiments of the present invention.

First Embodiment of the Level Shift Circuit

Description will be given firstly on the outline of a circuit configuration of a first embodiment of a level shift circuit of the present invention, with reference to FIG. 1, and after that, explanation will be given in more detail on the circuit configuration or an operation.

<Outline of the Circuit Configuration>

Figure 1:
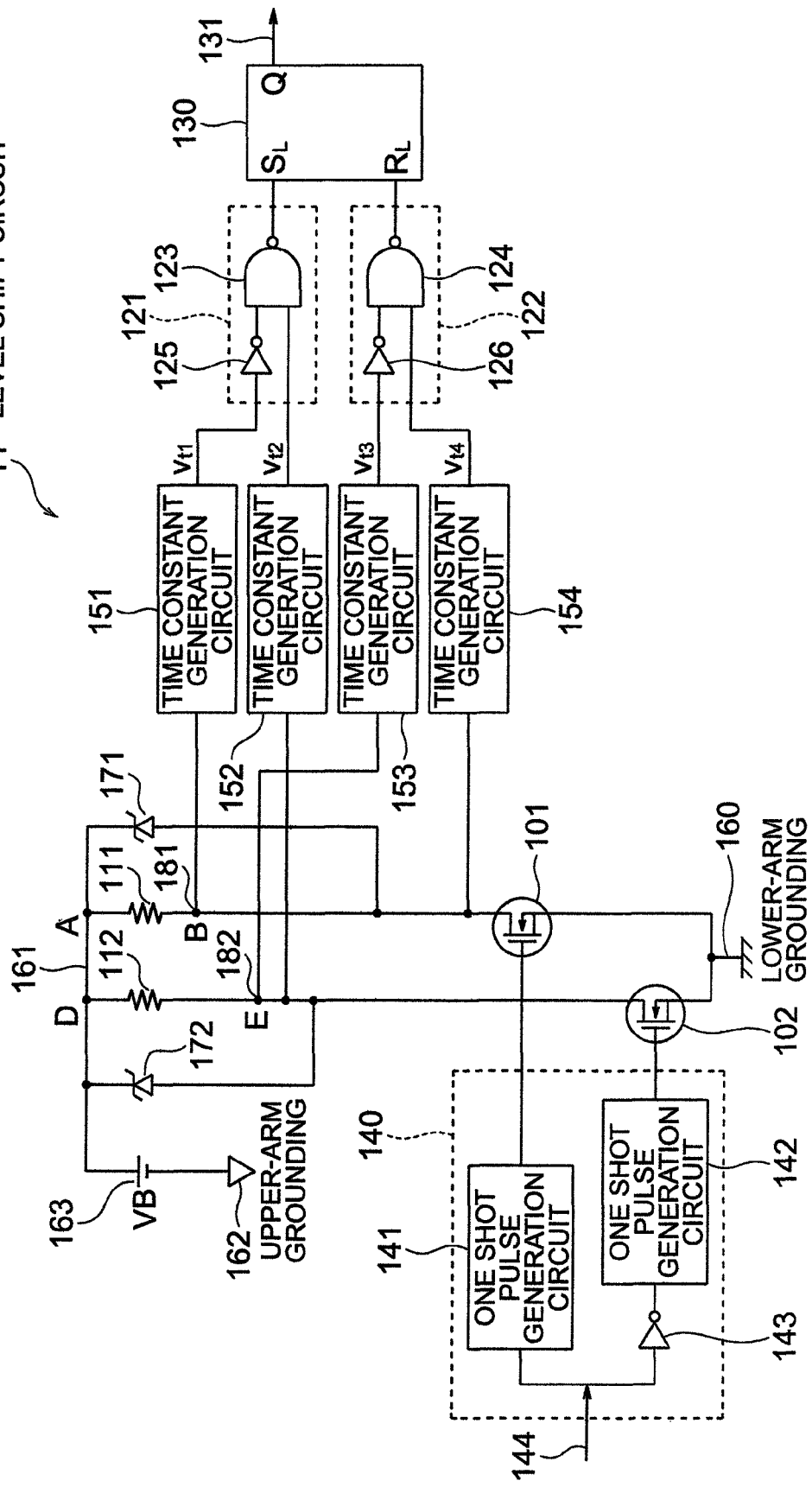
FIG. 1 is a circuit drawing representing a configuration of a first embodiment of a level shift circuit of the present invention.

FIG. 1 represents a circuit configuration of the first embodiment of the level shift circuit of the present invention. A level shift circuit 11 of FIG. 1 is operated by a low-voltage direct-current power source (not shown) and a high-voltage direct-current power source (VB) 163. One end of the high-voltage direct-current power source is a lower-arm grounding 160 that is a low voltage terminal, and the other end is a high-potential terminal 161 of the high-voltage direct-current power source. It should be noted that, as a grounding, there is an upper-arm grounding 162 different from the aforesaid lower-arm grounding 160, and the aforesaid high-voltage direct-current power source 163 supplies high voltage direct-current between the upper-arm grounding 162 and the high-potential terminal 161. The lower-arm grounding 160 and the upper-arm grounding 162 are both groundings, however, the groundings are separated so as not to easily receive mutual influence of the circuits belonging to themselves.

In FIG. 1, an input signal 144 of the level shift circuit 11 is inputted to a one-shot pulse generator 140 that generates an "H" pulse when the input signal changes. The one-shot pulse generator 140 is composed of a one-shot pulse generation circuit 141 for generating the "H" pulse at a rise of a signal in receiving the input signal 144; an inverter circuit 143 for inputting the input signal 144; and a one-shot pulse generation circuit 142 for generating the "H" pulse at the rise of a signal for inputting an output of this inverter circuit 143. At the rise, the input signal 144, the "H" pulse is outputted from the one-shot pulse generation circuit 141, and by combination of the inverter circuit 143 and the one-shot pulse generation circuit 142, the "H" pulse is outputted from the one-shot pulse generation circuit 142 at the fall of the input signal 144.

It should be noted that the above input signal 144, the one-shot pulse generation circuits 141 and 142, and the inverter circuit 143 are signals and circuits driven by the low-voltage direct-current power source.

Specific circuit configurations of the one-shot pulse generation circuits 141 and 142 will be described later.

In addition, sources of a high-voltage n-type MOSFET 101 (the first semiconductor switching element) that will generate signals for the set side of an RS (reset, set)-type flip-flop circuit 130, and a high-voltage n-type MOSFET 102 that will generate signals for the reset side are both grounded to the lower-arm grounding 160. To a gate input of the high-voltage n-type MOSFET 101, an output of the aforesaid one-shot pulse generation circuit 141 is connected. Further, an output of the aforesaid one-shot pulse generation circuit 142 is connected to a gate input of the high-voltage n-type MOSFET 102.

A drain of the high-voltage n-type MOSFET 101 of the set side is connected to one end of a resistance 111 (a connection point (B) 181). A drain of the high-voltage n-type MOSFET 102 of the reset side is connected to one end of a resistance 112 (a connection point (E) 182). The other ends of the resistance 111 and the resistance 112 are connected to a high-potential terminal (A, D) 161 of the high-voltage direct-current power source.

It should be noted that the high-voltage n-type MOSFET 101 and the high-voltage n-type MOSFET 102 are composed of the same device, and have nearly the same electric characteristics.

In addition, the resistance 111 and the resistance 112 have nearly the same resistance value.

Each of the input terminals of a time-constant generation circuit 151 and a time-constant generation circuit 154 is connected to the connection point 181 of the drain of the high-voltage n-type MOSFET 101 of the set side and the resistance 111 together. Each of the input terminals of a time-constant generation circuit 152 and a time-constant generation circuit 153 is connected to the connection point 182 of the drain of the high-voltage n-type MOSFET 102 of the reset side and the resistance 112 together.

The time-constant generation circuit 151 and the time-constant generation circuit 153 are composed of the same circuit, and have nearly the same characteristics. The time-constant generation circuit 152 and the time-constant generation circuit 154 are composed of the same circuit, and have nearly the same characteristics.

As to specific circuit configurations of the time-constant generation circuits 151, 153 and the time-constant generation circuits 152, 154, they will be described later.

A first logic circuit 121 is composed of a NAND (non-conjunction) circuit 123 and an inverter circuit 125. The input terminal of the inverter circuit 125 is connected to an output terminal of the aforesaid time-constant generation circuit 151, and an output terminal of the inverter circuit 125 is connected to the first input gate of the NAND circuit 123. An output terminal of the aforesaid time-constant generation circuit 152 is connected to the second input gate of the NAND circuit 123.

A second logic circuit 122 is composed of a NAND circuit 124 and an inverter circuit 126. The input terminal of the inverter circuit 126 is connected to an output terminal of the aforesaid time-constant generation circuit 153, and an output terminal of the inverter circuit 126 is connected to the first input gate of the NAND circuit 124. The output terminal of the aforesaid time-constant generation circuit 152 is connected to the second input gate of the NAND circuit 124.

An output terminal of the NAND circuit 123, which is the output terminal of the aforesaid first logic circuit 121, is connected to a set terminal $S_L$ of the RS-type flip-flop circuit 130. It should be noted that the set terminal $S_L$ operates by "L". Therefore, the set terminal $S_L$ is represented by a subscript L.

An output terminal of the NAND circuit 124, which is the output terminal of the aforesaid second logic circuit 122, is connected to a reset terminal $R_L$ of the flip-flop circuit 130. It should be noted that the reset terminal $R_L$ operates by "L". Therefore, the reset terminal $R_L$ is represented by a subscript L.

At an output terminal (Q) 131 of the flip-flop circuit 130, an output signal at the high-voltage side power source is obtained.

It should be noted that the aforesaid time-constant generation circuits 151, 152, 153 and 154, the inverter circuits 125 and 126, the NAND circuits 123 and 124, and the flip-flop circuit 130 operate under the high-voltage direct-current power source.

In addition, Zener diodes 171 and 172 are connected to both ends of the resistances 111 and 112, respectively. Because the high-potential terminal 161 of the high-voltage direct-current power source is also connected to a motor drive unit provided with an arm, voltage variation is large. The Zener diodes 171 and 172 prevent the input portions of the high-voltage n-type MOSFETs 101 and 102, the resistances 111 and 112, or the time-constant generation circuits 151, 152, 153 and 154, from exceeding a breakdown voltage and being destructed, in the case where the high-potential terminal 161 of the high-voltage direct-current power source varies.

<One-Shot Pulse Generation Circuit>

Explanation will be given below on a specific circuit of the one-shot pulse generation circuit 141 in the above-described one-shot pulse generator 140, with reference to FIG. 2.

Figure 2:
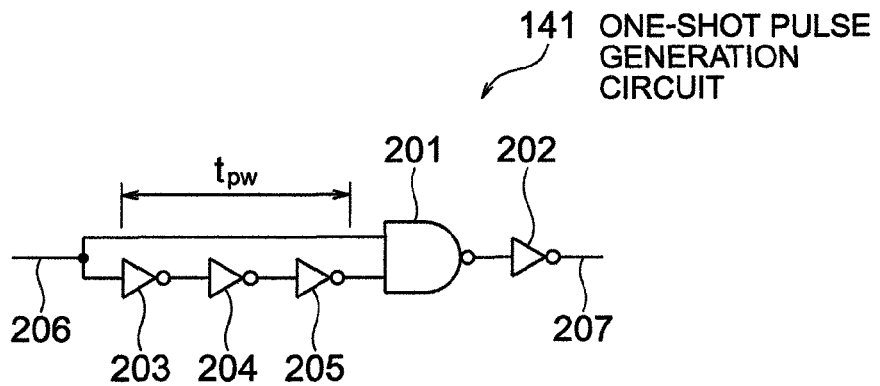
FIG. 2 is a circuit drawing representing a configuration example of a one-shot pulse generation circuit to be used in the level shift circuit of the present invention.

In FIG. 2, an input terminal 206 of the one-shot pulse generation circuit 141 is connected to a first input gate of a NAND circuit 201 and an input terminal of an inverter circuit 203. An output terminal of the inverter circuit 203 is connected to an input terminal of an inverter circuit 204. An output terminal of the inverter circuit 204 is connected to an input terminal of an inverter circuit 205. An output terminal of the inverter circuit 204 is connected to the input terminal of the inverter circuit 205. An output terminal of the inverter circuit 205 is connected to a second input gate of the NAND circuit 201. An output terminal of the NAND circuit 201 is connected to an input terminal of an inverter circuit 202. An output terminal 207 of the inverter circuit 202 becomes the output terminal 207 of the one-shot pulse generation circuit 141.

It should be noted that a total delay time, from the first inverter circuit 203 of the inverter circuits 203, 204 and 205 connected in series to the output to the last inverter circuit 205, is defined as $t_{PW}$.

In the above circuit configuration, because the number of stage of the inverter circuits 203, 204 and 205 connected in series is an odd number, either of the first and the second input gates of the NAND circuit 201 is "L", provided that the input signal of the input terminal 206 of the one-shot pulse generation circuit 141 is static, irrespective of being "H" or "L", the output of the NAND circuit 201 is "H", and the output of the inverter circuit 202 (the output terminal 207), that is, the output of the one-shot pulse generation circuit 141 (the output terminal 207), is "L".

However, in a dynamic operation, this is not the case. That is, when the input signal of the input terminal 206 of the one-shot pulse generation circuit 141 is "L", the output of the inverter circuit 205 is "H". In this case, when the input signal of the input terminal 206 changes to "H", the output of the inverter circuit 205 is kept "H" till the total delay time $t_{PW}$ of the inverter circuits 203, 204 and 205 connected in series elapses. Therefore, the output of the NAND circuit 201 becomes "L", and the output of the inverter circuit 202, that is, the output of the one-shot pulse generation circuit 141 becomes "H" till the time $t_{PW}$ elapses.

In this way, the one-shot pulse generation circuit 141 is configured to be a circuit for generating a pulse with a pulse width of $t_{PW}$, in the time of rising thereof, only when the input signal of the input terminal 206 changes from "L" to "H".

<Time-Constant Generation Circuit>

Figure 3:
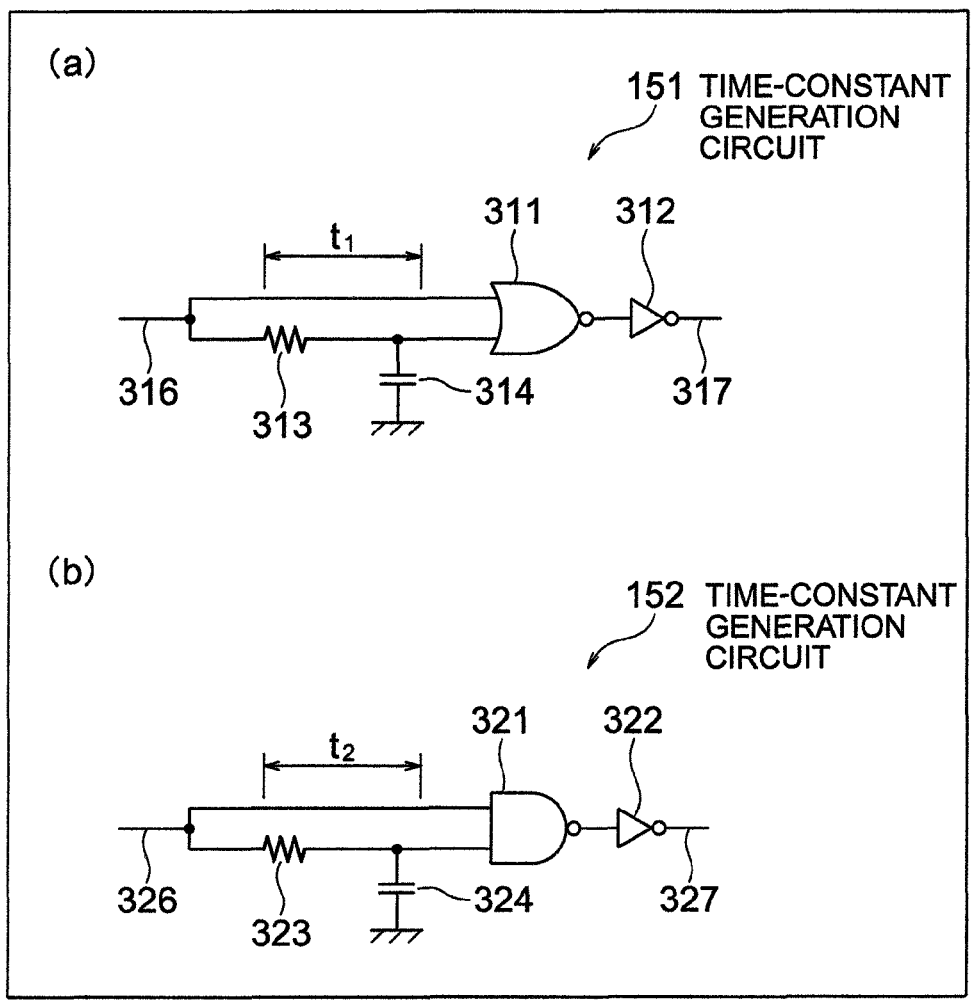
FIG. 3 is a circuit drawing representing a configuration example of a time-constant generation circuit to be used in the level shift circuit of the present invention.

FIG. 3 represents circuit configurations of the above-described time-constant generation circuits 151 to 154. However, because the time-constant generation circuit 151 (153) and the time-constant generation circuit 152 (154) are different in roles required, the circuit configurations differ. FIG. 3, (a) represents the circuit configuration used in the time-constant generation circuit 151 (153). In addition, FIG. 3, (b) represents the circuit configuration used in the time-constant generation circuit 152 (154). Explanation will be given below on this in sequence.

<Time-Constant Generation Circuits 151, 153>

FIG. 3, (a) is a circuit configuration used in the time-constant generation circuit 151 (153). In FIG. 3, (a), an input terminal 316 of the time-constant generation circuit 151 is connected to an first input gate of a NOR circuit 311 and one end of a resistance 313. The other end of the resistance 313 is connected to one end of a capacitor 314 and a second input gate of the NOR circuit 311. An output terminal of the NOR circuit 311 is connected to an input terminal of the inverter circuit 312. An output terminal of the inverter circuit 312 is an output terminal 317 of the time-constant generation circuit 151.

It should be noted that the other end of the capacitor 314 is connected to the grounding (the lower-arm grounding 160 (FIG. 1)).

In the above circuit configuration, in the case where the input terminal 316 of the time-constant generation circuit 151 changes from "L" to "H", the signal of "H" is transmitted immediately to the first input gate of the NOR circuit 311, and makes the output of the NOR circuit 311 to "L", and outputs "H" of the time-constant generation circuit 151, which is the output terminal of the inverter circuit 312, almost without delay time. That is, the signal "H" comes to be transmitted.

On the other hand, in the case where the input terminal 316 of the time-constant generation circuit 151 changes from "H" to "L", because the charge and voltage corresponding to the "H" in the previous state remain at the capacitor 314 and the output of the NOR circuit 311 is made "L" at the second input gate of the NOR circuit 311, the output of the NOR circuit 311 does not change immediately, even when the first input gate becomes "L". Therefore, the output of the time-constant generation circuit 151, which is the output terminal of the inverter circuit 312, maintains the state of "H". The output of the time-constant generation circuit 151 changes only after a time corresponding to a time-constant $t_1$ of the RC (CR) circuit with the resistance 313 and the capacitor 314 elapses, and the charge and voltage of the capacitor 314 decrease and a potential of the output from the capacitor becomes "L". At this time, the second input gate of the NOR circuit 311 becomes "L", the first and the second input gates of the NOR circuit 311 become "L" together, the output of the NOR circuit 311 becomes "H", and the output of the time-constant generation circuit 151, which is the output terminal of the inverter circuit 312, becomes "L". Thus, the signal "L" comes to be transmitted.

In this way, in the case where a signal of the input terminal 316 changes from "L" to "H", the time-constant generation circuit 151 of FIG. 3, (a) transmits the input signal of "H" immediately as the output signal "H", however, in the case where a signal of the input terminal 316 changes from "H" to "L", it is transmitted as "L" to the output signal, after the time corresponding to the time-constant $t_1$ elapses. In this way, the delay time of the signal transmission differs depending on whether the signal change is at the rise (rapid) or at the fall (slow).

It should be noted that "nearly without delay time" or "immediately transmits" means to be such a short period as can be sufficiently neglected, as compared with the time-constant $t_1$ of the RC (CR) circuit with the resistance 313 and the capacitor 314 that are provided to generate the delay time at the time-constant generation circuit 151.

<Time-Constant Generation Circuits 152, 154>

FIG. 3, (b) is a circuit configuration used in the time-constant generation circuit 152 (154). In FIG. 3, (b), an input terminal 326 of the time-constant generation circuit 152 is connected to a first input gate of an NAND circuit 321 and one end of a resistance 323. The other end of the resistance 323 is connected to one end of a capacitor 324 and a second input gate of the NAND circuit 321. An output terminal of the NAND circuit 321 is connected to an input terminal of an inverter circuit 322. An output terminal of the inverter circuit 322 is an output terminal 327 of the time-constant generation circuit 152.

It should be noted that the other end of the capacitor 324 is connected to the grounding (the lower-arm grounding 160 (FIG. 1)).

In the above circuit configuration, in the case where the input terminal 326 of the time-constant generation circuit 152 changes from "H" to "L", the signal of "L" is transmitted immediately to the first input gate of the NAND circuit 321, and makes the output of the NAND circuit 321 to "H", and outputs "L" of the time-constant generation circuit 152, which is the output terminal of the inverter circuit 322, almost without delay time. That is, the signal "L" comes to be transmitted.

On the other hand, in the case where the signal of the input terminal 326 of the time-constant generation circuit 152 changes from "L" to "H", because the charge and voltage corresponding to "L" in the previous state remain at the capacitor 324, and the output of the NAND circuit 321 is made "H" at the second input gate of the NAND circuit 321, the output of the NAND circuit 321 does not change immediately, even when the first input gate becomes "H". Therefore, the output of the time-constant generation circuit 152, which is the output terminal of the inverter circuit 322, maintains the state of "L".

The output of the time-constant generation circuit 152 changes only after a time corresponding to a time-constant $t_2$ of the RC (CR) circuit with the resistance 323 and the capacitor 324 elapses, and the charge and voltage of the capacitor 324 decrease and the potential of the output from the capacitor becomes "H". At this time, the second input gate of the NAND circuit 321 becomes "H", the first and the second input gates of the NAND circuit 321 become "H" together, the output of the NAND circuit 321 becomes "L", and the output of the time-constant generation circuit 152, which is the output terminal of the inverter circuit 322, becomes "H". Thus, the signal "H" comes to be transmitted.

In this way, in the case where a signal of the input terminal 326 changes from "H" to "L", the time-constant generation circuit 152 of FIG. 3(a) transmits the input signal "L" immediately as the output signal "L", however, in the case where a signal of the input terminal 316 changes from "L" to "H", it is transmitted as "H" to the output signal, after the time corresponding to the time-constant $t_2$ elapses. In this way, the delay time of the signal transmission differs depending on whether the signal change is at the rise (rapid) or at the fall (slow).

It should be noted that "nearly without delay time" or "immediately transmits" means to be such a short period as can be sufficiently neglected, as compared with the time-constant $t_2$ of the RC (CR) circuit with the resistance 323 and the capacitor 324, that are provided to generate the delay time at the time-constant generation circuit 152.

<Flip-Flop Circuit>

Explanation will be given below on a specific circuit configuration of the above-described flip-flop circuit 130, with reference to FIG. 5.

Figure 5:
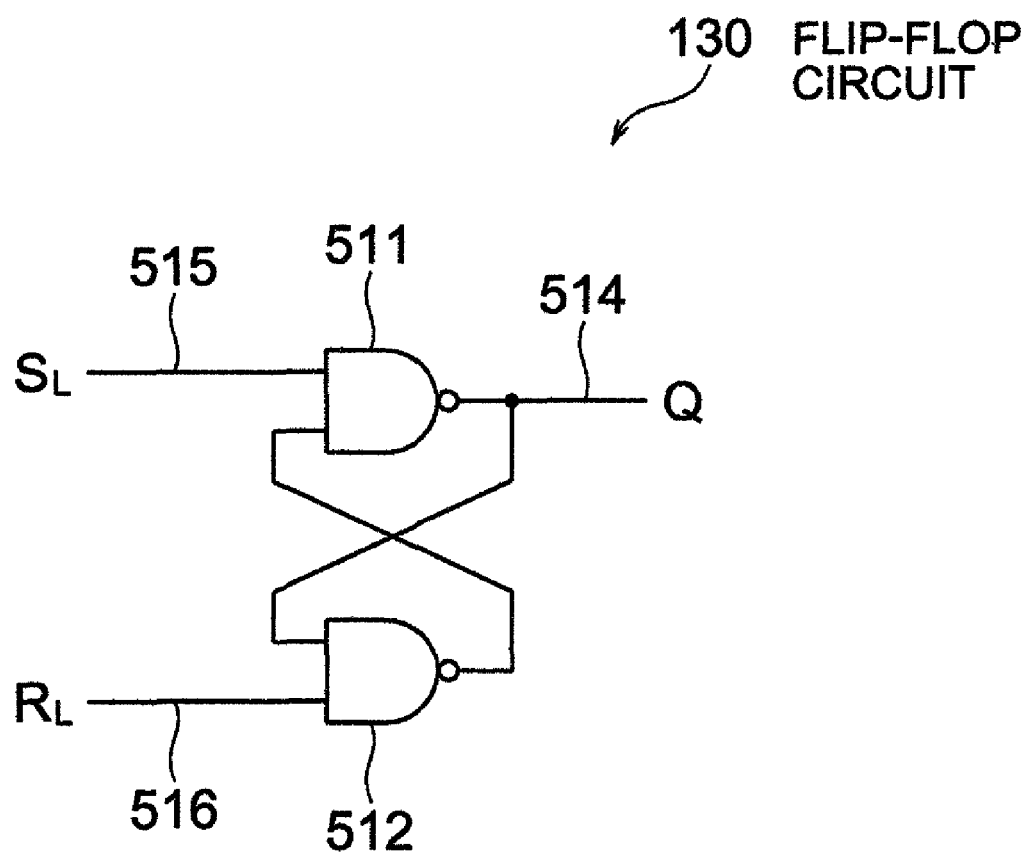
FIG. 5 is a circuit drawing representing a configuration example of a flip-flop circuit to be used in the level shift circuit of the present invention.

In FIG. 5, an output terminal of a NAND circuit 511 is connected to a first input gate of a NAND circuit 512. An output terminal of the NAND circuit 512 is connected to a second input gate of the NAND circuit 511. A first input gate of the NAND circuit 511 is a set terminal ($S_L$) 515 as the RS-type flip-flop circuit. A second input gate of the NAND circuit 512 is a reset terminal ($R_L$) 516 as the RS-type flip-flop circuit. The output terminal of the NAND circuit 511 is an output terminal (Q) 514 of the flip-flop circuit 130. It should be noted that the set terminal ($S_L$) 515 and the reset terminal $R_L$ operate by the "L" signal. Therefore, the set terminal ($S_L$) 515 and the reset terminal ($R_L$) 516 are represented by a subscript L.

<Circuit Operation of the First Embodiment (Usual Operation)>

Explanation will be given on operation of the first embodiment. Firstly, description will be given on usual operation as the level shift circuit 11.

In FIG. 1, in usual operation, when the input signal 144 of the level shift circuit 11 changes from "L" to "H", a pulse of "H" with a pulse width of $t_{PW}$ is generated at the output of the one-shot pulse generation circuit 141 in the one-shot pulse generator 140. Thereby, the high-voltage n-type MOSFET 101 of the set side becomes ON only for an interval when the pulse is positive, and a voltage drop is generated at the resistance 111. That is, a voltage of the connection point 181 decreases to become an "L" state.

The connection point 181 is inputted at the time-constant generation circuit 151, however, as described above, the time-constant generation circuit 151 is inputted to the inverter circuit 125, which is the first input terminal of the first logic circuit 121, after the delay time of the time-constant $t_1$ elapses. In this case, provided that $t_{PW} > t_1$, the inverter circuit 125 transmits the signal of "H" to the first input gate of the NAND circuit 123. In this time, because the signal of "H" is given to the second input gate of the NAND circuit 123 from a connection point 182 through the time-constant generation circuit 152, the output of the NAND circuit 123 becomes "L". Then, because the output "L" of this NAND circuit 123 inputs to the set terminal ($S_L$) that operates by the signal "L" of the flip-flop circuit 130, the output 131 of the flip-flop circuit 130 becomes "H".

It should be noted that, as described above, a specific structure of the flip-flop circuit 130 configures a latch circuit by the NAND circuit 511 and the NAND circuit 512, as represented in a circuit drawing of FIG. 5. Therefore, by inputting the signal "L" to the set terminal ($S_L$) 515, the output (Q) 514 of the NAND circuit 511 becomes "H". Because the output 514 of the NAND circuit 511 is inputted to the first input gate of the NAND circuit 512, and the second input gate of the NAND circuit 512 is the reset terminal ($R_L$) 516 and in a state of "H", the output of the NAND circuit 512 becomes "L" and maintains the output (Q) 514 of the NAND circuit 511 in the state of "H". Therefore, even if the set terminal ($S_L$) 515 has a pulse-like signal "L" (with a pulse width of about $t_{PW}$) and its pulse disappears to return to "H", the output (Q) 514 of the NAND circuit 511 is maintained in the state of "H". In addition, the output (Q) 514 of this NAND circuit 511 is the same output terminal as the output terminal (Q) 131 (FIG. 1) of the flip-flop circuit 130.

In this way, when the input signal 144 of the level shift circuit 11 changes from "L" to "H", the high-voltage n-type MOSFET 101 of the set side, the time-constant generation circuit 151 and the first logic circuit 121 operate by a pulse-like signal (with a pulse width of about $t_{PW}$), the signal of "H" is outputted from the flip-flop circuit 130, and the state of "H" is maintained. In the above operation process, the high-voltage n-type MOSFET 101 of the set side operates by the pulse-like (with a pulse width of about $t_{PW}$) signal "L", and therefore, power consumed becomes low.

Next, when the input signal 144 of the level shift circuit 11 changes from "H" to "L", the signal inverted at the inverter circuit 143 in the one-shot pulse generator 140 is inputted to the one-shot pulse generation circuit 142, and a pulse of "H" with a pulse width of $t_{PW}$ is generated at the output. Thereby, the high-voltage n-type MOSFET 102 of the reset side becomes ON only for an interval when the pulse is "H", and a voltage drop is generated at the resistance 112.

That is, the voltage of the connection point 182 decreases to become an "L" state. The connection point 182 is inputted to the time-constant generation circuit 153, while, as described above, the time-constant generation circuit 152 is inputted to the inverter circuit 126 which is the first input terminal of the second logic circuit 122, after the delay time of the time-constant $t_1$ elapses. In this case, provided that $t_{PW} > t_1$, the inverter circuit 126 transmits the signal of "H" to the first input gate of the NAND circuit 124. In this case, because the signal of "H" is provided to the second input gate of the NAND circuit 124 from a connection point 181 through the time-constant generation circuit 154, the output of the NAND circuit 124 becomes "L". In addition, because the output "L" of this NAND circuit 124 inputs to the reset terminal ($R_L$) which operates by the signal "L" of the flip-flop circuit 130, the output 131 of the flip-flop circuit 130 becomes "L".

It should be noted that as described above, the specific structure of the flip-flop circuit 130 configures a latch circuit by the NAND circuit 511 and the NAND circuit 512, as represented in a circuit drawing of FIG. 5. Therefore, by inputting the "L" signal to the reset terminal ($R_L$) 516, the output of the NAND circuit 512 becomes "H". Because the set terminal ($S_L$) 515 is in the state of "H", the output (Q) 514 of the NAND circuit 511 becomes "L". That is, the output terminal (Q) 131 of the flip-flop circuit 130 becomes "L".

It should be noted that because the output 514 of the NAND circuit 511 is inputted to the first input gate of the NAND circuit 512, the output 514 becomes "L", and maintains the output of the NAND circuit 512 in the state of "H". Therefore, even if the reset terminal ($R_L$) 516 has a pulse-like signal "L" (with a pulse width of about $t_{PW}$) and that pulse disappears to return to "H", the output of the NAND circuit 512 is maintained in the state of "H". Therefore the output (Q) 514 of the NAND circuit 511 is maintained in the state of "L", as long as the set terminal ($S_L$) 515 is "H".

In this way, when the input signal 144 of the level shift circuit 11 changes from "H" to "L", the high-voltage n-type MOSFET 102 of the reset side, the time-constant generation circuit 153 and the second logic circuit 122 operate by a pulse-like signal (with a pulse width of about $t_{PW}$), the signal of "L" is outputted from the flip-flop circuit 130, and the state of "L" is maintained. In process of the above operation, the high-voltage n-type MOSFET 102 of the reset side operates by the pulse-like signal (with a pulse width of about $t_{PW}$), and therefore, power consumed becomes low.

<Operation in the Power Source Variation of the First Embodiment>

Operation of the first embodiment is as explained above, however, because the present invention assumes the level shift circuit of a motor drive unit provided with an arm, it is further preferable to take measures not to generate a malfunction even when power-source voltage variation occurs by an influence of a reactance of the motor.

Explanation will be given next, with reference to FIG. 1, on operation when voltage change dV/dt (power-source voltage variation) is generated between upper- and lower-arm groundings (between the upper-arm grounding 162 and the lower-arm grounding 160). When the power-source voltage variation is generated, because there is parasitic capacitance in the high-voltage n-type MOSFETs 101 and 102, a voltage drop is generated at both the resistance 111 and the resistance 112. Explanation will be given on circuit operation in this case, with reference to FIG. 4A and FIG. 4B.

FIG. 4A represents the case where the power-source voltage increased (V→V+ΔV). It should be noted that, in FIG. 4A, an X-axis is elapsing time. In this case, a voltage drop is generated both at the resistance 111 and the resistance 112, and a potential difference is generated between B-A (between B181-A161) and E-D (between E182-D161) of FIG. 1. This potential difference may exceed a threshold value (logic level, $V_{TH}$) of the logic of the high voltage side circuit that uses the high-voltage direct-current power source including the time-constant generation circuits 151, 152, 153 and 154. In FIG. 4A, a situation is represented that the voltage between B-A (similarly between E-D) varies to decrease from $V_{BA}$ to $-\Delta V_{BA}$, and exceeds $V_{TH}$, which is the threshold value of the logic. In this case, a waveform of the items expressed by $V_{LB}$ and $V_{LE}$ in FIG. 4 is a schematic simple expression, in view of whether $V_{TH}$ which is the threshold value of the logic is exceeded or not. That is, for a range where the voltage drop is smaller than $V_{TH}$, $V_{LB}$ and $V_{LE}$ are expressed as "H", while for a range where the voltage drop is larger than $V_{TH}$, $V_{LB}$ and $V_{LE}$ are expressed as "L".

In addition, because when a charge corresponding to the voltage variation is accumulated to the parasitic capacitance of the high-voltage n-type MOSFETs 101 and 102, even when the power-source voltage is maintained in the increased state as it is, electric current does not flow more than that, the potential differences between B-A (between B181-A161) and E-D (between E 182-D161) gradually decrease before long. In this process, the voltage drop becomes smaller than $V_{TH}$ again.

In this case, in the time-constant generation circuit 151, as described above, in the change of "L", the output operates after the time $t_1$ elapses from the input time, and in the change of "H", the output operates immediately after the input time. Therefore, for this voltage change, the output operates after the time $t_1$ elapses in the time-constant generation circuit 151 (153). In addition, the time-constant generation circuit 152 operates immediately.

Therefore, an output waveform of the time-constant generation circuit 151 (153) becomes an operation waveform of an item $V_{t1}$ of FIG. 4A. In addition, in the time-constant generation circuit 152, as described above, the output operates immediately from the input time in the change of "L", while in the change of "H", the output operates after the time $t_1$ elapses from the input. Therefore, the output waveform of the time-constant generation circuit 152 (154) becomes the operation waveform of an item $V_{t2}$ of FIG. 4A.

In the case where the power source voltage increases to exceed the threshold value of logic (logic level, $V_{TH}$) of the high voltage side circuit, this influence occurs also at the connection point 181 and the connection point 182 of FIG. 1. If these occurred at the connection point 181 and the connection point 182 simultaneously, because this is a voltage drop, they are both equivalent to the input of "L" if the logic operation is judged based on the threshold value $V_{TH}$ of the logic of the high voltage side circuit. As an operation relating to the signal of the set side, in the waveform of the time-constant generation circuit 151 connected to the B point 181, the output operates after $t_1$ elapsed from the input time. In addition, in the waveform of the time-constant generation circuit 153 connected to the E point 182, the output operates immediately from the input time.

In addition, even when the power-source voltage is maintained in the increased state as it is, the potential differences between B-A (between B181-A161) and E-D (between E182-D161) gradually decrease before long. In this process, the voltage drop becomes smaller than $V_{TH}$ again, and in the case where the threshold value $V_{TH}$ becomes equal to "H", in an output waveform of the time-constant generation circuit 151 connected to the B point 181, the output operates immediately from the input time. In addition, in an output waveform of the time-constant generation circuit 153 connected to the E point 182, the output operates after the time $t_2$ elapses from the input time.

The waveforms of the above operation state are shown in the item $V_{t1}$ and item $V_{t2}$ of FIG. 4A. In comparing the waveform of this $Vt_1$ and the waveform of this $Vt_2$, the time-constant generation circuit 152 forms an interval that becomes "L" first and then "H", before or after an interval that the time-constant generation circuit 151 becomes "L". Therefore, by variation of the power-source voltage, the time-constant generation circuit 151 becomes "L", and the time-constant generation circuit 152 becomes "L" just before and just after an input of an erroneous signal to the first logic circuit 121, which corresponds to masking operation and thus prevents an output of the erroneous signal from the first logic circuit 121. In this way, the output of the erroneous set signal caused by the variation of power-source voltage is prevented.

In addition, similarly also in operation relating to a signal of the reset side, in relation to the output waveform of the time-constant generation circuit 153 connected to the E point 182 and the output waveform of the time-constant generation circuit 154 connected to the B point 181, the time-constant generation circuit 153 forms a interval that becomes "L" first and then "H", before or after an interval that the time-constant generation circuit 153 becomes "L". In this way, the time-constant generation circuit 154 becomes "L" just before and just after an input of an erroneous signal to the second logic circuit 122, which corresponds to masking operation and thus prevents an output of the erroneous signal from the second logic circuit 122. In this way, the output of the erroneous reset signal caused by the variation of power-source voltage is prevented.

The above is the case where power source voltage increases, however, FIG. 4B represents the case where an increase and a decrease are repeated.

In FIG. 4B, such a case is represented that the power source voltage once increased decreases again. It represents the case where the power source voltage increases to the exceed threshold value $V_{TH}$ of the logic of the high voltage side circuit, and abruptly returns within a timing that the potential difference between B-A (between B181-A161) and between E-D (between E182-D161) does not sufficiently return to the original level. In this case, the power-source voltage (voltage between the upper- and the lower-arm groundings) and potential difference between B-A and E-D are as represented in the drawing, and potential difference between B-A and E-D returns earlier as compared with FIG. 4A, but as for operations of $V_{LB}$, $V_{LE}$, $V_{t1}$ and $V_{t2}$ thereto, there is no essential difference to the case of FIG. 4A. Therefore, even when there is such power-source voltage variation as exceeds the threshold value $V_{TH}$ of the logic of the high-voltage side circuit, malfunction can be prevented also in the signals of the set side and the reset side.

Second Embodiment of the Level Shift Circuit

Figure 6:
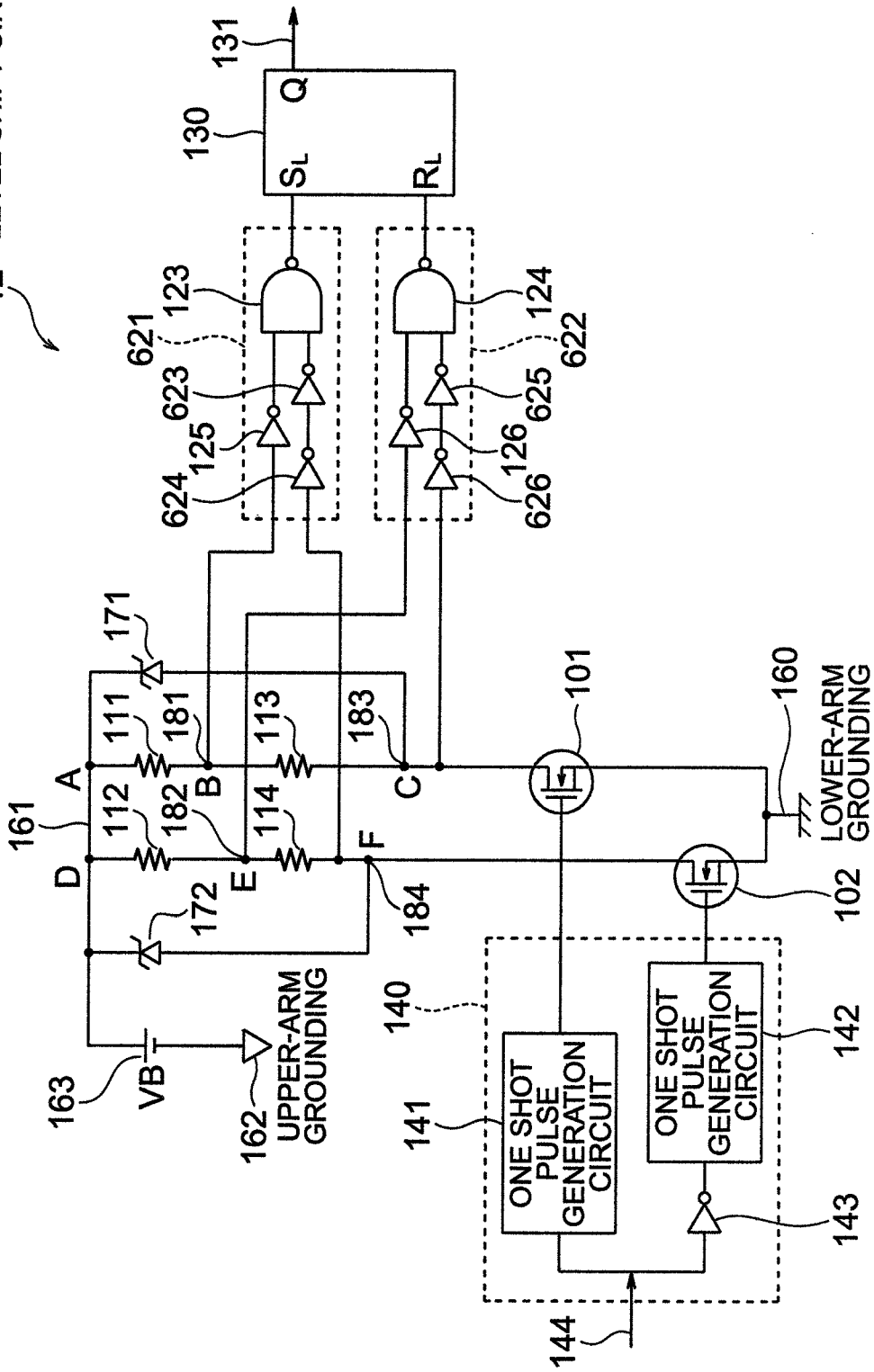
FIG. 6 is a circuit drawing representing a configuration of a second embodiment of a level shift circuit of the present invention.

FIG. 6 represents a second embodiment of the level shift circuit of the present invention. Description will be given firstly on an outline of the circuit configuration, and next explanation will be given on its operation. It should be noted that elements common to the first embodiment were given with the same reference signs to omit explanation thereof accordingly.

<Outline of the Circuit Configuration>

The level shift circuit 12 of FIG. 6 operates by the low-voltage direct-current power source (not shown) and the high-voltage direct-current power source (VB) 163. One end of the high-voltage direct-current power source is the lower-arm grounding 160, which is a low voltage terminal, and the other end is the high-potential terminal 161 of the high-voltage direct-current power source. It should be noted that, as the grounding, there is the upper-arm grounding 162 different from the above lower-arm grounding 160, and the aforesaid high-voltage direct-current power source 163 supplies a high-voltage direct-current power to the upper-arm grounding 162 and the high-potential terminal 161 of the high-voltage direct-current power source. The lower-arm grounding 160 and the upper-arm grounding 162 are both the groundings but the groundings are separated so as not to easily receive a mutual influence of the circuits belonging to each.

In FIG. 6, an input signal 144 of a level shift circuit 12 is inputted to a one-shot pulse generator 140 that generates a "H" pulse when the input signal changes. The one-shot pulse generator 140 is composed of a one-shot pulse generation circuit 141 for generating the "H" pulse at the rise of a signal in receiving the input signal 144; an inverter circuit 143 for inputting the input signal 144; and a one-shot pulse generation circuit 142 for generating the "H" pulse at the rise of a signal that inputs an output of the inverter circuit 143. At the rise of the input signal 144, the "H" pulse is outputted from the one-shot pulse generation circuit 141, and by combination of the inverter circuit 143 and the one-shot pulse generation circuit 142, the "H" pulse is outputted from the one-shot pulse generation circuit 142 at the fall of the input signal 144.

It should be noted that the above input signal 144, the one-shot pulse generation circuits 141 and 142, and the inverter circuit 143 are signals and circuits driven by the low-voltage direct-current power source.

In addition, sources of the high-voltage n-type MOSFET 101 (the first semiconductor switching element) that will generate a signal of the set side of the RS-type flip-flop circuit 130, and the high-voltage n-type MOSFET 102 (the second semiconductor switching element) that will generate a signal of the reset side are both grounded to the lower-arm grounding 160. Output of the foresaid one-shot pulse generation circuit 141 is connected to a gate input of the high-voltage n-type MOSFET 101. In addition, an output of the above one-shot pulse generation circuit 142 is connected to a gate input of the high-voltage n-type MOSFET 102.

A drain of the high-voltage n-type MOSFET 101 of the set side is connected to one end of a resistance 113 (a connection point (C) 183). The other end of the resistance 113 is connected to one end of a resistance 111 (a connection point (B) 181). The other end of the resistance 111 is connected to a high-potential terminal (A) 161 of the high-voltage direct-current power source.

A drain of the high-voltage n-type MOSFET 102 of the reset side is connected to one end of a resistance 114 (a connection point (F) 184). The other end of the resistance 114 is connected to one end of a resistance 112 (a connection point (E) 182). The other end of the resistance 112 is connected to a high-potential terminal (D) 161 of the high-voltage direct-current power source.

It should be noted that the high-voltage n-type MOSFET 101 and the high-voltage n-type MOSFET 102 are composed of the same device, and have nearly the same electric characteristics.

The resistance 111 and the resistance 112 have nearly the same resistance value. In addition, the resistance 113 and the resistance 114 have nearly the same resistance value.

A first logic circuit 621 is composed of a NAND circuit 123, an inverter circuit 125, an inverter circuit 623 and an inverter circuit 624. An input terminal of the inverter circuit 125 is connected to a connection point (B) 181, and an output terminal of the inverter circuit 125 is connected to a first input gate of the NAND circuit 123. An input terminal of the inverter circuit 624 is connected to a connection point (F) 184, an output terminal of the inverter circuit 624 is connected to an input terminal of an inverter circuit 623, and an output terminal of the inverter circuit 623 is connected to a second input gate of the NAND circuit 123.

A second logic circuit 622 is composed of a NAND circuit 124, an inverter circuit 126, an inverter circuit 625 and an inverter circuit 626. An input terminal of the inverter circuit 126 is connected to a connection point (E) 182, and an output terminal of the inverter circuit 126 is connected to a first input gate of the NAND circuit 124. An input terminal of the inverter circuit 626 is connected to a connection point (C) 183, an output terminal of the inverter circuit 626 is connected to an input terminal of the inverter circuit 625, and an output terminal of the inverter circuit 625 is connected to a second input gate of the NAND circuit 124.

An output terminal of the NAND circuit 123, which is an output terminal of the above first logic circuit 621, is connected to a set terminal $S_L$ of a flip-flop circuit 130. It should be noted that the set terminal $S_L$ operates by a signal of "L". An output terminal of the NAND circuit 124, which is an output terminal of the aforesaid second logic circuit 622, is connected to a reset terminal $R_L$ of the flip-flop circuit 130. It should be noted that the reset terminal $R_L$ operates by the signal of "L". At an output terminal (Q) 131 of the flip-flop circuit 130, an output signal at the high-voltage side power source is obtained.

In addition, a Zener diode 171 is connected between a connection point 183, where a drain of the high-voltage n-type MOSFETs 101 and one end of the resistance 113 are connected, and the high-voltage power source terminal 161.

A Zener diode 172 is connected between a connection point 184, where a drain of the high-voltage n-type MOSFETs 102 and one end of the resistance 114 are connected, and the high-voltage power source terminal 161.

<Circuit Operation of the Second Embodiment (Usual Operation)>

Explanation will be given on operation of a second embodiment. Firstly, description will be given on usual operation as a level shift circuit 12, with reference to FIG. 6.

In usual operation, when the input signal 144 of the level shift circuit 12 changes from "L" to "H", a pulse of "H" with a pulse width of $t_{PW}$ is generated at the output of the one-shot pulse generation circuit 141 in the one-shot pulse generator 140. Thereby, the high-voltage n-type MOSFET 101 of the set side becomes ON only for an interval where the pulse is positive, and a voltage drop is generated at the resistance 111. That is, the voltage of the connection point 181 decreases to become an "L" state. This signal is inputted to the inverter circuit 125, which is the first input of the first logic circuit 621. The inverter circuit 125 transmits the signal of "H" to the first input gate of the NAND circuit 123.

In this case, because the signal of "H" is given to the second input gate of the NAND circuit 123 from the connection point 184 through the inverter circuit 624 and the inverter circuit 623, the output of the NAND circuit 123 becomes "L". Then, because the output "L" of this NAND circuit 123 inputs to the set terminal ($S_L$) that operates by the signal "L" of the flip-flop circuit 130, the output 131 of the flip-flop circuit 130 becomes "H".

It should be noted that the specific structure of the flip-flop circuit 130 configures, as described above, a latch circuit by the NAND circuit 511 and the NAND circuit 512, as represented in a circuit drawing of FIG. 5. Therefore, the output 131 of the flip-flop circuit 130 maintains the state of "H". In the above operation process, the high-voltage n-type MOSFET 101 of the set side operates by a pulse-like signal "L" (with a pulse width of about $t_{PW}$), therefore, power consumed becomes low.

Next, when the input signal 144 of the level shift circuit 12 changes from "H" to "L", the signal inverted at the inverter circuit 143 in the one-shot pulse generator 140 is inputted to the one-shot pulse generation circuit 142, and the pulse of "H" with the pulse width of $t_{PW}$ is generated at the output. Thereby, the high-voltage n-type MOSFET 102 of the reset side becomes ON only for an interval where the pulse is positive, and voltage drop is generated at the resistance 112. That is, voltage at the connection point 182 decreases and becomes the "L" state.

This signal is inputted to the inverter circuit 126 which is the first input of the second logic circuit 622. The inverter circuit 126 transmits the signal of "H" to the first input gate of the NAND circuit 124. In this case, because the signal of "H" is given to the second input gate of the NAND circuit 124 from the connection point 183 through the inverter circuit 626 and the inverter circuit 625, the output of the NAND circuit 124 becomes "L". In addition, because the output "L" of this NAND circuit 124 inputs to the reset terminal ($R_L$) which operates by the signal "L" of the flip-flop circuit 130, the output 131 of the flip-flop circuit 130 becomes "L".

It should be noted that, as described above, the specific structure of the flip-flop circuit 130 composes a latch circuit by the NAND circuit 511 and the NAND circuit 512, as represented in a circuit drawing of FIG. 5. Therefore, the output 131 of the flip-flop circuit 130 maintains the state of "L". In the above operation process, the high-voltage n-type MOSFET 102 of the set side operates by the pulse-like signal "L" (with a pulse width of about $t_{PW}$), therefore, power consumed becomes low.

<Operation in Power Source Variation of the Second Embodiment>

Explanation will be given next on operation in power source variation of the second embodiment, with reference to FIG. 6 and FIG. 7.

In FIG. 6, explanation will be given on operation when a voltage change dV/dt (power-source voltage variation) is generated between the upper- and lower-arm groundings (between the upper-arm grounding 162 and the lower-arm grounding 160). When a power-source voltage variation is generated, because there is a parasitic capacitance in the high-voltage n-type MOSFETs 101 and 102, a voltage drop is generated at both the resistance 111 and the resistance 112. Explanation will be given on the circuit operation in this case, with reference to FIG. 7.

Figure 7:
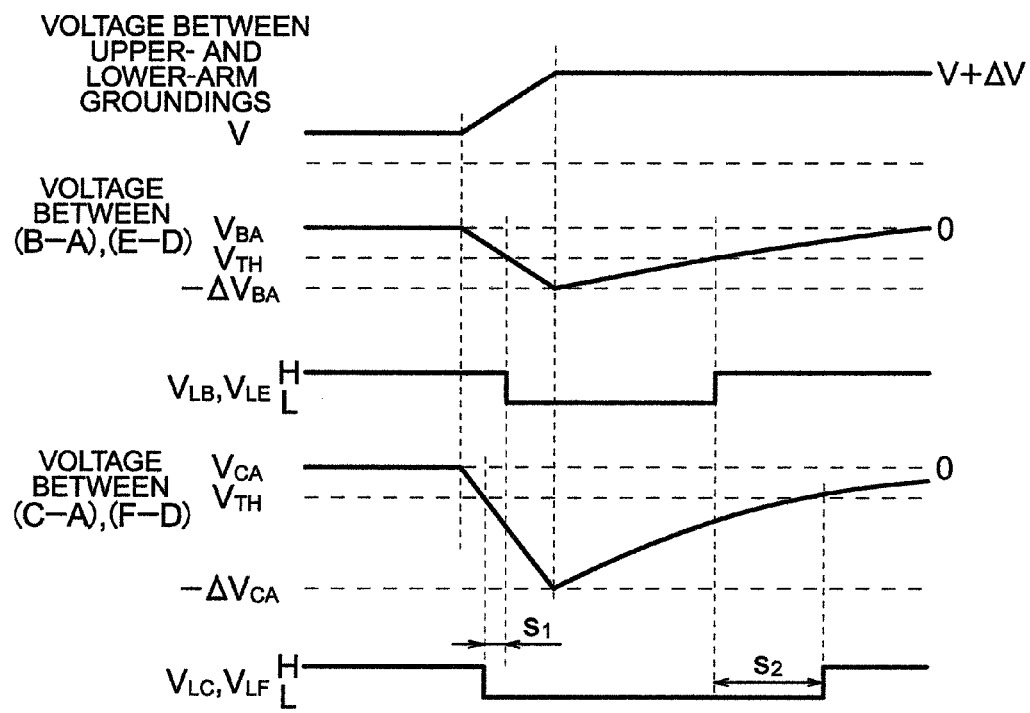
FIG. 7 is a time chart representing an operation of a logic circuit, when there is a power source voltage variation of the first example in the second embodiment of the level shift circuit of the present invention.

FIG. 7 represents the case where the power-source voltage increased (V→V+ΔV). It should be noted that in FIG. 7 the X-axis is a time elapsed. In this case, a voltage drop is generated both at the resistance 111 and the resistance 113, along with the resistance 112 and the resistance 114. A potential difference is generated between B-A (between B181-A161) and B-A (between C183-A161), along with between E-D (between E182-D161) and between F-D (between F184-D161) of FIG. 6. This potential difference may exceed the threshold value of logic (logic level, $V_{TH}$) of the high voltage side circuit that uses the high-voltage direct-current power source.

In FIG. 7, an aspect is represented that the voltage between B-A (similarly between E-D) varies to decrease from $V_{BA}$ to $-\Delta V_{BA}$, and exceeds $V_{TH}$ which is the threshold value of the logic. In addition, an aspect is represented that the voltage between B-A (similarly between F-D) varies to decrease from $V_{CA}$ to $-\Delta V_{CA}$, and exceeds $V_{TH}$ which is the threshold value of the logic.

In this case, waveforms of items expressed by $V_{LB}$ and $V_{LE}$, and $V_{LC}$ and $V_{LF}$ in FIG. 7 are schematic simple expressions, in view of whether $V_{TH}$ which is the threshold value of the logic is exceeded or not. That is, for a range where the voltage drop is smaller than $V_{TH}$, $V_{LB}$, $V_{LE}$, $V_{LC}$ and $V_{LF}$ is expressed as "H", while for a range where the voltage drop is larger than $V_{TH}$, $V_{LB}$, $V_{LE}$, $V_{LC}$ and $V_{LF}$ is expressed as "L".

As described above, because, even when power source voltage is maintained an increased state as it is, electric current does not flow more than that when a charge is accumulated to the parasitic capacitance of the high-voltage n-type MOSFETs 101 and 102, the potential differences between B-A (between B181-A161) and E-D (between E182-D161) gradually decrease before long. In this process, the voltage drop becomes smaller than $V_{TH}$ again.

In this case, the input of the inverter circuit 125 relating to a signal of the set side receives potential difference variation between B-A at the connection point 181, and the input of the inverter circuit 624 receives the potential difference variation between F-D (between C-A) at the connection point 184. As represented in FIG. 7, the potential difference variation between F-D (between C-A) is larger and occurs more rapidly as compared with between B-A, therefore, $V_{LC}$ and $V_{LF}$ change from "H" to "L" faster by $S_1$ (time) than $V_{LB}$ and $V_{LE}$.

In addition, in the case where the power-source voltage is maintained at an increased state as it is, and electric current comes not to flow in the parasitic capacitance of the high-voltage n-type MOSFETs 101 and 102, and the potential differences between B-A (between B181-A161) and E-D (between E182-D161) gradually decrease, because the potential difference between B-A is smaller than the potential difference between E-D from the start, $V_{LB}$ and $V_{LE}$ returns from "L" to "H" faster by $S_2$ (time) than $V_{LC}$ and $V_{LE}$.

Therefore, the inverter circuit 125 operates in accordance with the waveform of the item of $V_{LB}$ and $V_{LE}$ of FIG. 7 in receiving the power-source voltage variation, and the inverter circuit 624 operates in accordance with the waveform of the item of $V_{LC}$ and $V_{LF}$. Accordingly, before a signal of malfunction caused by the voltage variation passes through the inverter circuit 125 and causes the NAND circuit 123 to malfunction, the inverter circuit 624 transmits a mask signal not to cause the NAND circuit 123 to malfunction, earlier by $S_1$. In addition, after elapsing a time by $S_2$ after the signal to cause malfunction disappears from the inverter circuit 125, the mask signal to prevent the malfunction is cleared.

In this way, the output of the set signal caused by the power-source voltage variation is prevented.

In addition, operation relating to a signal of the reset side is also similar, and the input of the inverter circuit 126 relating to the signal of the reset side receives the same potential difference variation between B-A at the connection point 182, and the input of the inverter circuit 626 receives the potential difference variation between C-A at the connection point 183. Because these have the same circuit configuration, the output of the reset signal caused by the variation of the power-source voltage is prevented similarly.

In addition, in the power-source voltage variation, although there is an effect not only when the voltage increases but also when the voltage returns, the operation and action are nearly the same, therefore detailed explanation will be omitted.

Third Embodiment of the Level Shift Circuit

Figure 8:
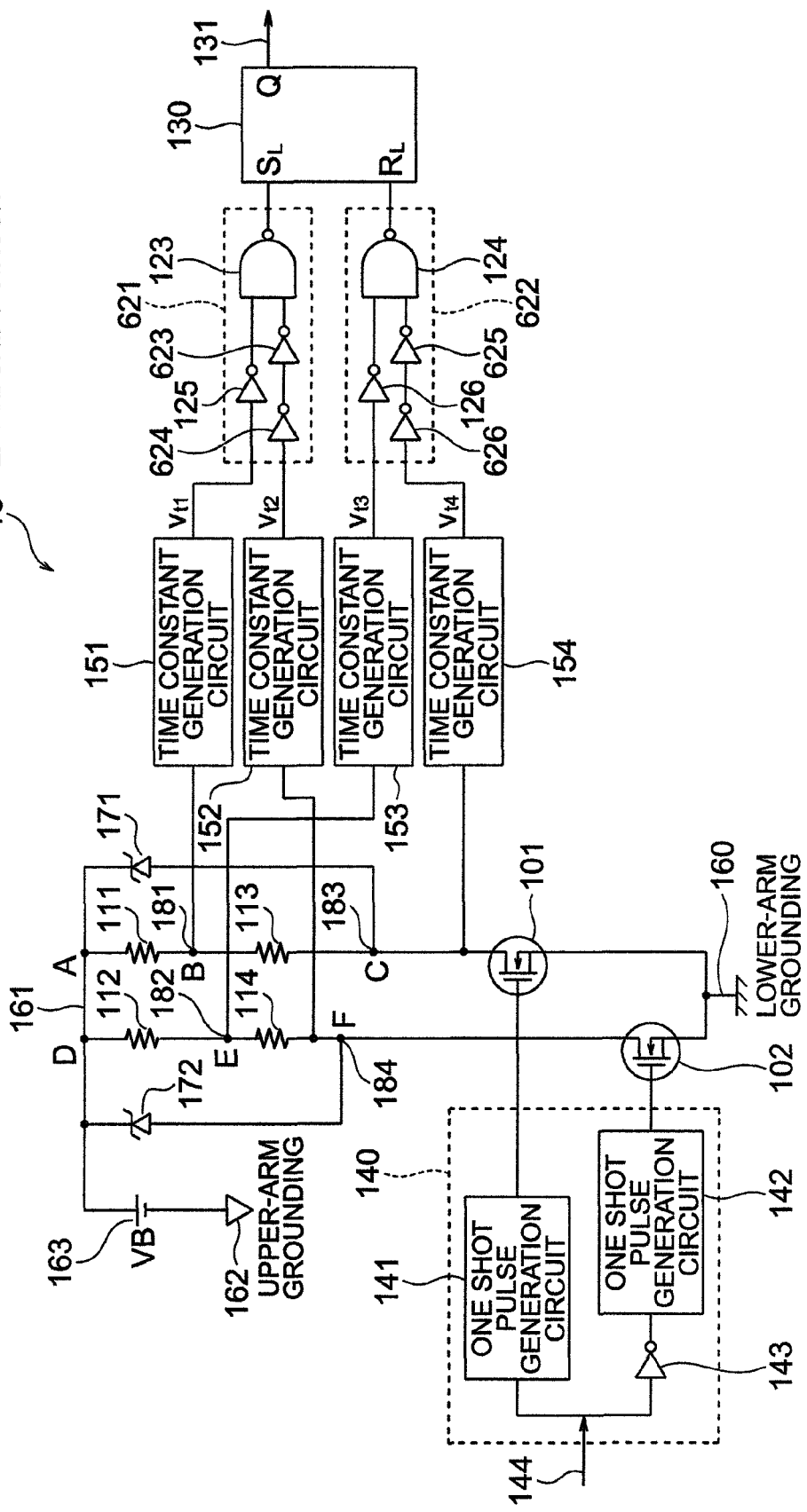
FIG. 8 is a circuit drawing representing a configuration of a third embodiment of the level shift circuit of the present invention.

FIG. 8 represents the third embodiment of the level shift circuit of the present invention. Description will be given firstly on outline of the circuit configuration, and next explanation will be given on the operation.

<Outline of the Circuit Configuration>

A level shift circuit 13 of FIG. 8 operates by the low-voltage direct-current power source (not shown) and the high-voltage direct-current power source (VB) 163. One end of the high-voltage direct-current power source is the lower-arm grounding 160, which is a low voltage terminal, and the other end is the high-potential terminal 161 of the high-voltage direct-current power source. It should be noted that, as the grounding, there is the upper-arm grounding 162 different from the aforesaid lower-arm grounding 160, and the aforesaid high-voltage direct-current power source 163 supplies high-voltage direct-current power to the upper-arm grounding 162 and the high-potential terminal 161 of the high-voltage direct-current power source. The lower-arm grounding 160 and the upper-arm grounding 162 are both groundings but the groundings are separated so as not to easily receive a mutual influence of the circuits belonging to each.

In FIG. 8, an input signal 144 of the level shift circuit 13 is inputted to a one-shot pulse generator 140 that generates a "H" pulse when the input signal changes. The one-shot pulse generator 140 is composed of a one-shot pulse generation circuit 141 that generates the "H" pulse at the rise of a signal in receiving the input signal 144; an inverter circuit 143 for inputting the input signal 144; and a one-shot pulse generation circuit 142 that generates the "H" pulse at the rise of a signal that inputs an output of the inverter circuit 143. At the rise of the input signal 144, the "H" pulse is outputted from the one-shot pulse generation circuit 141, and by combination of the inverter circuit 143 and the one-shot pulse generation circuit 142, the "H" pulse is outputted from the one-shot pulse generation circuit 142 at the fall of the input signal 144.

It should be noted that the above input signal 144, the one-shot pulse generation circuits 141 and 142, and the inverter circuit 143 are signals and circuits driven by the low-voltage direct-current power source.

In addition, sources of a high-voltage n-type MOSFET 101 (the first semiconductor switching element) that will generate a signal of the set side of a RS-type flip-flop circuit 130, and a high-voltage n-type MOSFET 102 (the second semiconductor switching element) that will generate a signal of the reset side are both grounded to the lower-arm grounding 160. To a gate input of the high-voltage n-type MOSFET 101, an output of the aforesaid one-shot pulse generation circuit 141 is connected. In addition, to a gate input of the high-voltage n-type MOSFET 102, an output of the aforesaid one-shot pulse generation circuit 142 is connected.

A drain of the high-voltage n-type MOSFET 101 of the set side is connected to one end of a resistance 113 (a connection point (C) 183). The other end of the resistance 113 is connected to one end of a resistance 111 (a connection point (B)

181). The other end of the resistance 111 is connected to the high-potential terminal (A) 161 of the high-voltage direct-current power source.

A drain of the high-voltage n-type MOSFET 102 of the reset side is connected to one end of a resistance 114 (a connection point (F) 184). The other end of the resistance 114 is connected to one end of a resistance 112 (a connection point (E) 182). The other end of the resistance 112 is connected to the high-potential terminal (D) 161 of the high-voltage direct-current power source.

It should be noted that the high-voltage n-type MOSFET 101 and the high-voltage n-type MOSFET 102 are composed of the same device, and have nearly the same electric characteristics.

The resistance 111 and the resistance 112 have nearly the same resistance value. In addition, the resistance 113 and the resistance 114 have nearly the same resistance value.

An input terminal of a time-constant generation circuit 151 is connected to the connection point (B) 181 of the resistance 111 and the resistance 113 at the set side. An input terminal of a time-constant generation circuit 152 is connected to the connection point (F) 184 of a drain of the high-voltage n-type MOSFET 102 of the reset side and the resistance 114. An input terminal of a time-constant generation circuit 153 is connected to the connection point (E) 182 of the resistance 112 and the resistance 114 of the reset side. An input terminal of a time-constant generation circuit 154 is connected to the connection point (C) 183 of a drain of the high-voltage n-type MOSFET 101 of the set side and the resistance 113.

A first logic circuit 621 is composed of a NAND circuit 123, an inverter circuit 125, an inverter circuit 623 and an inverter circuit 624. An input terminal of the inverter circuit 125 is connected to an output terminal of the aforesaid time-constant generation circuit 151, and the output terminal of the inverter circuit 125 is connected to a first input gate of the NAND circuit 123. An input terminal of the inverter circuit 624 is connected to the output terminal of the aforesaid time-constant generation circuit 152; an output terminal of the inverter circuit 624 is connected to an input terminal of the inverter circuit 623; and an output terminal of the inverter circuit 623 is connected to a second input gate of the NAND circuit 123.

A second logic circuit 622 is composed of a NAND circuit 124, an inverter circuit 126, an inverter circuit 625 and an inverter circuit 626. An input terminal of the inverter circuit 126 is connected to an output terminal of the aforesaid time-constant generation circuit 153, and the output terminal of the inverter circuit 126 is connected to a first input gate of the NAND circuit 124. An input terminal of the inverter circuit 626 is connected to the output terminal of the aforesaid time-constant generation circuit 154; an output terminal of the inverter circuit 626 is connected to an input terminal of the inverter circuit 625; and an output terminal of the inverter circuit 625 is connected to the second input gate of the NAND circuit 124.

To a set terminal $S_L$ of the flip-flop circuit 130, an output terminal of the NAND circuit 123 which is an output terminal of the aforesaid first logic circuit 621 is connected. It should be noted that the set terminal $S_L$ operates by a signal of "L". To a reset terminal $R_L$ of the flip-flop circuit 130, an output terminal of the NAND circuit 124 which is an output of the aforesaid second logic circuit 622, is connected. It should be noted that the reset terminal $R_L$, operates by the signal of "L". At an output terminal (Q) 131 of the flip-flop circuit 130, an output signal at the high-voltage side power source is obtained.

In addition, a Zener diode 171 is connected between the connection point 183, to where a drain of the high-voltage n-type MOSFETs 101 and one end of the resistance 113 are connected, and the high-potential terminal 161 of the high-voltage direct-current power source. A Zener diode 172 is connected between the connection point 184, where a drain of the high-voltage n-type MOSFETs 102 and one end of the resistance 114 are connected, and the high-potential terminal 161 of the high-voltage direct-current power source.

<Circuit Operation of the Third Embodiment (Usual Operation)>

Explanation will be given on operation of a third embodiment. Firstly, description will be given on usual operation as the level shift circuit 13.

In usual operation, when the input signal 144 of the level shift circuit 13 changes from "L" to "H", a positive ("H") pulse with a pulse width of $t_{PW}$ is generated at the output of the one-shot pulse generation circuit 141 in the one-shot pulse generator 140. Thereby, the high-voltage n-type MOSFET 101 of the set side becomes ON only for an interval the pulse is positive, and a voltage drop is generated at the resistance 111.

That is, the voltage of the connection point 181 decreases to become an "L" state. The connection point 181 is inputted at the time-constant generation circuit 151, however, as described above, the time-constant generation circuit 151 is inputted to the inverter circuit 125 which is the first input of the first logic circuit 621, after a delay time of a time-constant $t_1$ elapses. In this case, provided that $t_{PW} > t_1$, the inverter circuit 125 transmits the signal of "H" to the first input gate of the NAND circuit 123. The inverter circuit 125 transmits the signal of "H" to the first input gate of the NAND circuit 123.

In this case, because the signal of "H" is given to the second input gate of the NAND circuit 123 from a connection point 184 through the time-constant generation circuit 152, the inverter circuit 624 and the inverter circuit 623, the output of the NAND circuit 123 becomes "L". In addition, because the output "L" of this NAND circuit 123 inputs to the set terminal ($S_L$) that operates by the signal "L" of the flip-flop circuit 130, the output 131 of the flip-flop circuit 130 becomes "H".

It should be noted that, as described above, the specific configuration of the flip-flop circuit 130 composes a latch circuit by the NAND circuit 511 and the NAND circuit 512, as represented in a circuit drawing of FIG. 5. Therefore, the output 131 of the flip-flop circuit 130 maintains the state of "H". In the above operation process, the high-voltage n-type MOSFET 101 of the set side operates by a pulse-like (with a pulse width of about $t_{PW}$) signal, therefore, power consumed becomes low.

Next, when the input signal 144 of the level shift circuit 13 changes from "H" to "L", the signal inverted at the inverter circuit 143 in the one-shot pulse generator 140 is inputted to the one-shot pulse generation circuit 142, and the pulse of "H" with the pulse width of $t_{PW}$ is generated at the output. Thereby, the high-voltage n-type MOSFET 102 of the reset side becomes ON only for an interval where the pulse is "H", and a voltage drop is generated at the resistance 112. That is, the voltage of the connection point 182 decreases to become the "L" state. The connection point 182 is inputted at the time-constant generation circuit 153, however, as described above, the time-constant generation circuit 153 is inputted to the inverter circuit 126 which is the first input of the second logic circuit 622, after a delay time of the time-constant $t_1$ elapses. In this case, provided that $t_{PW} > t_1$, the inverter circuit 126 transmits the signal of "H" to the first input gate of the NAND circuit 124.

In this case, because the signal of "H" is given to the second input gate of the NAND circuit 124 from the connection point 183 through the time-constant generation circuit 154, the inverter circuit 626 and the inverter circuit 625, the output of the NAND circuit 124 becomes "L". In addition, because the output "L" of this NAND circuit 124 inputs to the reset terminal ($R_L$) which operates by the signal "L" of the flip-flop circuit 130, the output 131 of the flip-flop circuit 130 becomes "L".

It should be noted that, as described above, the specific structure of the flip-flop circuit 130 configures a latch circuit by the NAND circuit 511 and the NAND circuit 512, as represented in a circuit drawing of FIG. 5. Therefore, the output 131 of the flip-flop circuit 130 maintains the state of "L". In the above operation process, the high-voltage n-type MOSFET 102 of the set side operates by a pulse-like (with a pulse width of about $t_{PW}$) signal, therefore, power consumed becomes low.

<Operation in Power Source Variation of the Third Embodiment>

Explanation will be given next on operation when a voltage change dV/dt (power source voltage variation) is generated between the upper- and lower-arm groundings (between the upper-arm grounding 162 and the lower-arm grounding 160), in FIG. 9. When a power-source voltage variation is generated, because there is a parasitic capacitance in the high-voltage n-type MOSFETs 101 and 102 in FIG. 8, a voltage drop is generated at both the resistance 111 and the resistance 112. Explanation will be given on circuit operation in this case, with reference to FIG. 9.

Figure 9:
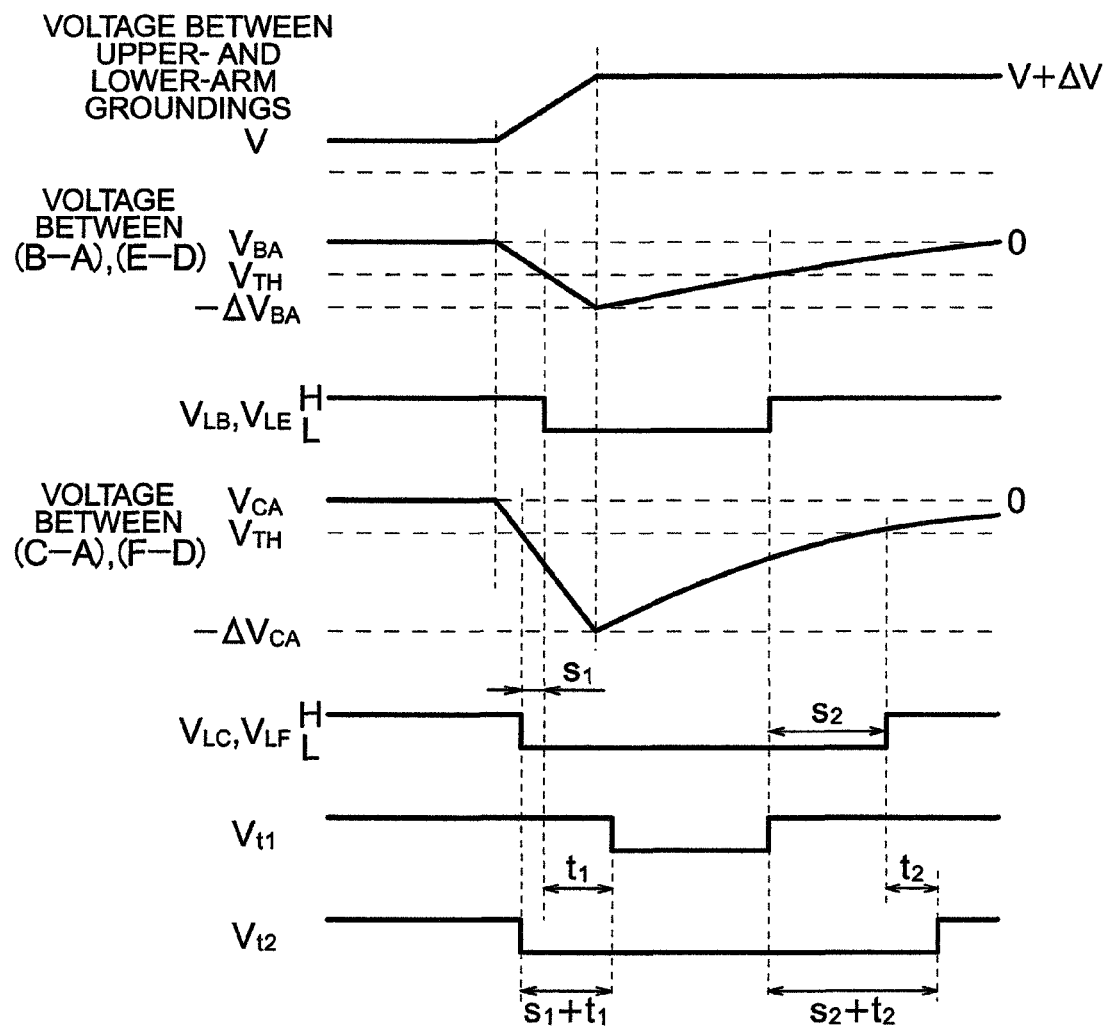
FIG. 9 is a circuit drawing representing the operation of the time-constant generation circuit, when there is a power source voltage variation of the first example in the third embodiment of the level shift circuit of the present invention.

FIG. 9 represents the case where the power-source voltage increases (V→V+ΔV). In this case, a voltage drop is generated at the resistance 111 and the resistance 113, along with the resistance 112 and the resistance 114. A potential difference is generated between B-A (between B181-A161) and between C-A (between C181-A161), along with E-D (between E182-D161) and F-D (between F184-D161) of FIG. 8. This potential difference may exceed the threshold value of logic (logic level, $V_{TH}$) of the high voltage side circuit that uses the high-voltage direct-current power source.

In FIG. 9, an aspect is represented that voltage between B-A (similarly between E-D) varies to decrease from $V_{BA}$ to $-\Delta V_{BA}$, and exceeds $V_{TH}$, which is threshold value of the logic. In addition, In this case, an aspect is also represented that the voltage between C-A (similarly between F-D) varies to decrease from $V_{CA}$ to $-\Delta V_{CA}$, and exceeds $V_{TH}$, which is the threshold value of the logic.

In this case, waveforms of items expressed by $V_{LB}$ and $V_{LE}$, and items expressed by $V_{LC}$ and $V_{LF}$, in FIG. 9 are schematic simple expressions, in view of whether $V_{TH}$ which is the threshold value of the logic is exceeded or not. That is, for a range where the voltage drop is smaller than $V_{TH}$, $V_{LB}$, $V_{LE}$, $V_{LC}$ and $V_{LF}$ is expressed as "H", while for a range where the voltage drop is larger than $V_{TH}$, $V_{LB}$, $V_{LE}$, $V_{LC}$ and $V_{LF}$ is expressed as "L".

As described above, because, even when power source voltage is maintained at an increased state as it is, electric current does not flow more than that when a charge corresponding to voltage variation is accumulated to the parasitic capacitance of the high-voltage n-type MOSFETs 101 and 102, the potential differences between B-A (between B181-A161) and E-D (between E182-D161) gradually decrease before long. In this process, the voltage drop becomes smaller than $V_{TH}$ again.

In this case, the input of the time-constant generation circuit 151 relating to a signal of the set side receives potential difference variation between B-A at the connection point 181, and the input of the time-constant generation circuit 152 receives the potential difference variation between F-D (between C-A) at the connection point 184. As represented in FIG. 9, the potential difference variation between F-D (between C-A) is larger and occurs more rapidly as compared with between B-A, therefore, $V_{LC}$ and $V_{LF}$ change from "L" to "H" faster by $S_1$ than $V_{LB}$ and $V_{LE}$.

In addition, in the case where the power source voltage is maintained an increased state as it is, and electric current becomes not to flow in the parasitic capacitance of the high-voltage n-type MOSFETs 101 and 102, and the potential differences between B-A (between B181-A161) and E-D (between E182-D161) gradually decrease, because potential difference is small from the start, $V_{LB}$ and $V_{LE}$ returns from "L" to "H" faster by $S_2$ (time) than $V_{LC}$ and $V_{LE}$.

Further, as described above, the time-constant generation circuit 151 has the characteristics of delaying by $t_1$ in becoming "L", and the time-constant generation circuit 152 has the characteristics of delaying by $t_2$ in becoming "H", therefore each operation waveform of $V_{t1}$ which is the output of the time-constant generation circuit 151, and $V_{t2}$ which is the output of the time-constant generation circuit 152, becomes as represented in FIG. 9. The output of the time-constant generation circuit 151 passes through the inverter circuit 125 and is inputted to the first input gate of the NAND circuit 123. In addition, the output of the time-constant generation circuit 152 passes through the inverter circuit 624 and the inverter circuit 623, and is inputted to the second input gate of the NAND circuit 123.

Accordingly, before the signal of malfunction caused by the voltage variation passes through the inverter circuit 125 and causes the NAND circuit 123 to malfunction, the inverter circuit 624 and the inverter circuit 623 transmit a mask signal not to cause the NAND circuit 123 to malfunction, earlier by $(S_1+S_2)$. In addition, after elapsing a time by $(S_2+t_2)$ after a signal to cause the malfunction disappears from the inverter circuit 125, the mask signal to prevent the malfunction is cleared.

In this way, the output of the set signal caused by the power-source voltage variation is prevented by double measures.

In addition, operation relating to a signal of the reset side is also similar, and the input of the inverter circuit 126 relating to the signal of the reset side receives the same potential difference variation between B-A at the connection point 182, and the input of the inverter circuit 626 receives the potential difference variation between C-A at the connection point 183. Because they have the same circuit configuration including the time-constant generation circuits 153 and 154, the output of the reset signal caused by the variation of the power source voltage is prevented similarly.

In addition, in the power source voltage variation, although there is an effect not only when the voltage increases but also when the voltage returns, the operation and action are nearly the same, therefore detailed explanation will be omitted.

Fourth Embodiment of the Level Shift Circuit

Figure 10:
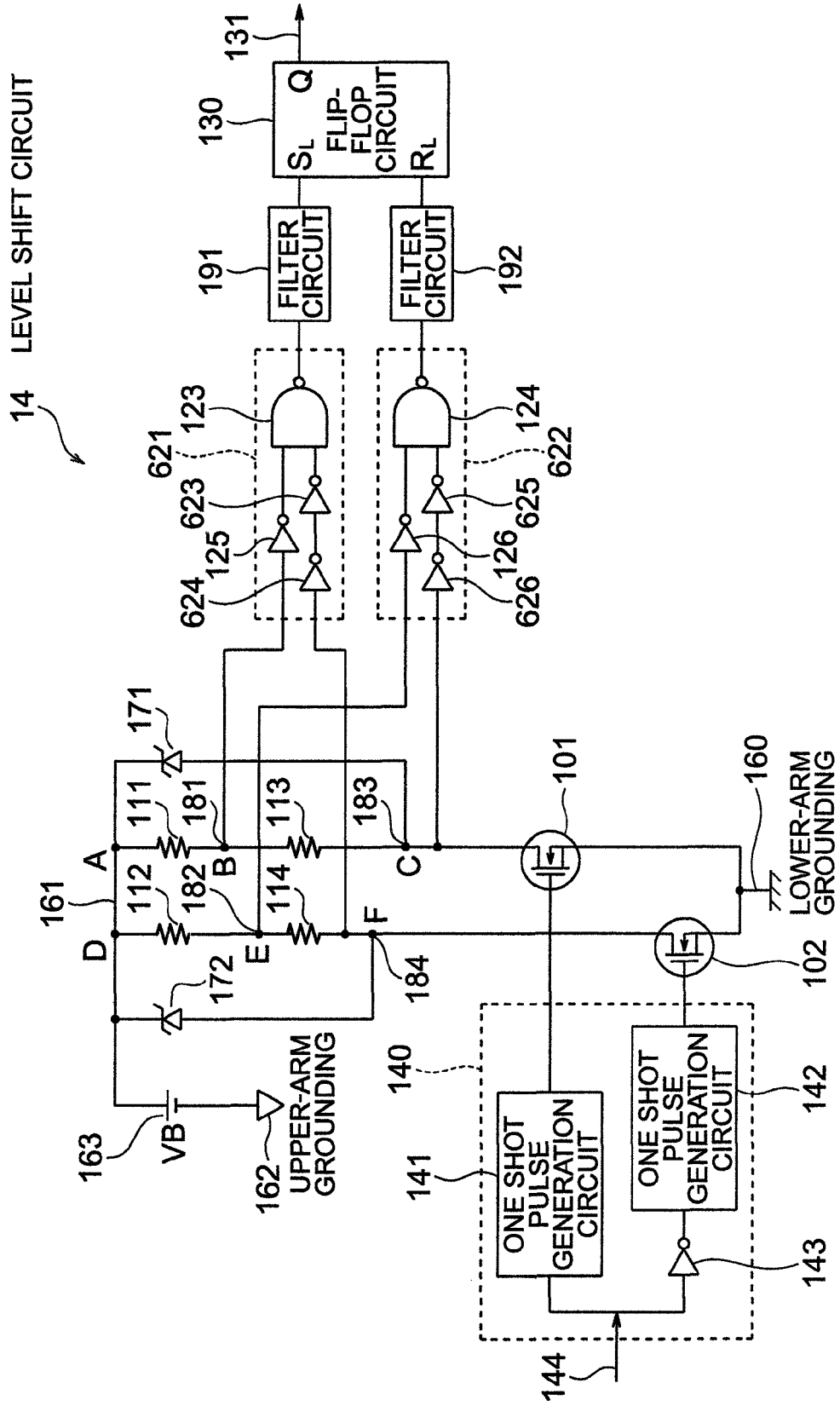
FIG. 10 is a circuit drawing representing a configuration of a fourth embodiment of a level shift circuit of the present invention.

FIG. 10 represents the fourth embodiment of the level shift circuit of the present invention. Description will be given firstly on outline of the circuit configuration, and next explanation will be given on the operation.

<Outline of the Circuit Configuration>

The level shift circuit 14 of FIG. 10 operates by the low-voltage direct-current power source (not shown) and the high-voltage direct-current power source (VB) 163. One end of the high-voltage direct-current power source is the lower-arm grounding 160, which is a low voltage terminal, and the other end is the high-potential terminal 161 of the high-voltage direct-current power source. It should be noted that, as the grounding, there is the upper-arm grounding 162 different from the aforesaid lower-arm grounding 160, and the aforesaid high-voltage direct-current power source 163 supplies a high-voltage direct-current power to the upper-arm grounding 162 and the high-potential terminal 161 of the high-voltage direct-current power source. The lower-arm grounding 160 and the upper-arm grounding 162 are both the groundings but the groundings are separated so as not to easily receive a mutual influence of the circuits belonging to each.

In FIG. 10, an input signal 144 of the level shift circuit 14 is inputted to a one-shot pulse generator 140 that generates a "H" pulse when the input signal changes. The one-shot pulse generator 140 is composed of the one-shot pulse generation circuit 141 that generates the "H" pulse at the rise a signal in receiving the input signal 144; the inverter circuit 143 for inputting the input signal 144; and a one-shot pulse generation circuit 142 that generates the "H" pulse at the rise a signal that inputs an output of the inverter circuit 143. At the rise of the input signal 144, the "H" pulse is outputted from the one-shot pulse generation circuit 141, and by combination of the inverter circuit 143 and the one-shot pulse generation circuit 142, the "H" pulse is outputted from the one-shot pulse generation circuit 142 at the fall of the input signal 144.

It should be noted that the above input signal 144, the one-shot pulse generation circuits 141 and 142, and the inverter circuit 143 are signals and circuits driven by the low-voltage direct-current power source.

In addition, sources of the high-voltage n-type MOSFET 101 (the first semiconductor switching element) of the set side, and the high-voltage n-type MOSFET 102 (the second semiconductor switching element) of the reset side are both grounded to the lower-arm grounding 160. To a gate input of the high-voltage n-type MOSFET 101, output of the aforesaid one-shot pulse generation circuit 141 is connected. In addition, an output of the aforesaid one-shot pulse generation circuit 142 is connected to a gate input of the high-voltage n-type MOSFET 102.

A drain of the high-voltage n-type MOSFET 101 of the set side is connected to one end of a resistance 113 (a connection point (C) 183). The other end of the resistance 113 is connected to one end of a resistance 111 (a connection point (B) 181). The other end of the resistance 111 is connected to a high-potential terminal (A) 161 of the high-voltage direct-current power source.

A drain of the high-voltage n-type MOSFET 102 of the reset side is connected to one end of a resistance 114 (a connection point (F) 184). The other end of the resistance 114 is connected to one end of a resistance 112 (a connection point (E) 182). The other end of the resistance 112 is connected to a high-potential terminal (D) 161 of the high-voltage direct-current power source It should be noted that the high-voltage n-type MOSFET 101 and the high-voltage n-type MOSFET 102 are composed of the same device, and have nearly the same electric characteristics.

The resistance 111 and the resistance 112 have nearly the same resistance value. In addition, the resistance 113 and the resistance 114 have nearly the same resistance value.

A first logic circuit 621 is composed of a NAND circuit 123, an inverter circuit 125, an inverter circuit 623 and an inverter circuit 624. An input terminal of the inverter circuit 125 is connected to the connection point (B) 181, and an output terminal of the inverter circuit 125 is connected to a first input gate of the NAND circuit 123. An input terminal of the inverter circuit 624 is connected to the connection point (F) 184; an output terminal of the inverter circuit 624 is connected to an input terminal of the inverter circuit 623; and an output terminal of the inverter circuit 623 is connected to a second input gate of the NAND circuit 123.

A second logic circuit 622 is composed of a NAND circuit 124, an inverter circuit 126, an inverter circuit 625 and the inverter circuit 626. An input terminal of the inverter circuit 126 is connected to the connection point (E) 182, and an output terminal of the inverter circuit 126 is connected to a first input gate of the NAND circuit 124. An input terminal of the inverter circuit 626 is connected to the connection point (C) 183; the output terminal of the inverter circuit 626 is connected to an input terminal of the inverter circuit 625; and an output terminal of the inverter circuit 625 is connected to a second input gate of the NAND circuit 124.

An output of the first logic circuit 621 and also an output of the NAND circuit 123 is inputted to a filter circuit 191 configured by a CR circuit composed of a resistance and a capacitor.

In addition, an output of the second logic circuit 622 and also an output of the NAND circuit 124 is inputted to a filter circuit 192 configured by a CR circuit composed of a resistance and a capacitor.

An output terminal of the aforesaid filter circuit 191 is connected to a set terminal $S_L$ of the flip-flop circuit 130. It should be noted that the set terminal $S_L$ operates by a signal of "L". An output terminal of the aforesaid filter circuit 192 is connected to a reset terminal $R_L$ of the flip-flop circuit 130. It should be noted that the reset terminal $R_L$ operates by the signal of "L". At an output terminal (Q) 131 of the flip-flop circuit 130, an output signal at the high-voltage side power source is obtained.

In addition, a Zener diode 171 is connected between the connection point 183, where a drain of the high-voltage n-type MOSFETs 101 and one end of the resistance 113 are connected, and the high-voltage power source terminal 161.

A Zener diode 172 is connected between the connection point 184, where a drain of the high-voltage n-type MOSFETs 102 and one end of the resistance 114 are connected, and the high-voltage power source terminal 161.

The above circuit is one further provided with the filter circuit 191 and the filter circuit 192 to the output of the first logic circuit 621 and the output of the second logic circuit 622, respectively, for the second embodiment represented in FIG. 6. Therefore, the fourth embodiment also has the operation and effect of the second embodiment represented in FIG. 6, and it is one added with a function to remove a weaker malfunction signal with a narrow pulse width with the additional filter circuit 191 and filter circuit 192.

Other Embodiment of the Level Shift Circuit

Explanation was given above on an embodiment of the level shift circuit, however, each circuit configuring the level shift circuit is not limited thereto.

In FIG. 2, a circuit was represented where three inverter circuits 203, 204 and 205 are connected in three stages in series, as a delay element of the one-shot pulse generation circuit 141, however, the inverter circuit is sufficient as long as it contains odd number stages, and may also be a circuit comprised of one stage inverter, or five or larger odd number stages of inverter circuits connected in series. In addition, the delay time $t_{PW}$ may be set or added by installing a CR circuit composed of a resistance and a capacitor at an output terminal of the inverter circuit 203 or the inverter circuit 204 or the inverter circuit 205.

Further, in FIG. 2, by replacing the NAND circuit 201 configuring the one-shot pulse generation circuit 141 with the NOR circuit, the one-shot pulse generation circuit that generates a pulse at the fall of the input signal can be configured. However, it is necessary to omit the inverter circuit 202, or to add one stage of inverter circuit next to the inverter circuit 202 to make the "H" pulse.

Further, by using a one-shot pulse generation circuit where the NAND circuit 201 configuring the one-shot pulse generation circuit 141 is replaced with the NOR circuit, instead of the one-shot pulse generation circuit 142 of FIG. 1, it is also possible to omit the inverter circuit 143 in the one-shot pulse generator 140 in FIG. 1.

Figure 11:
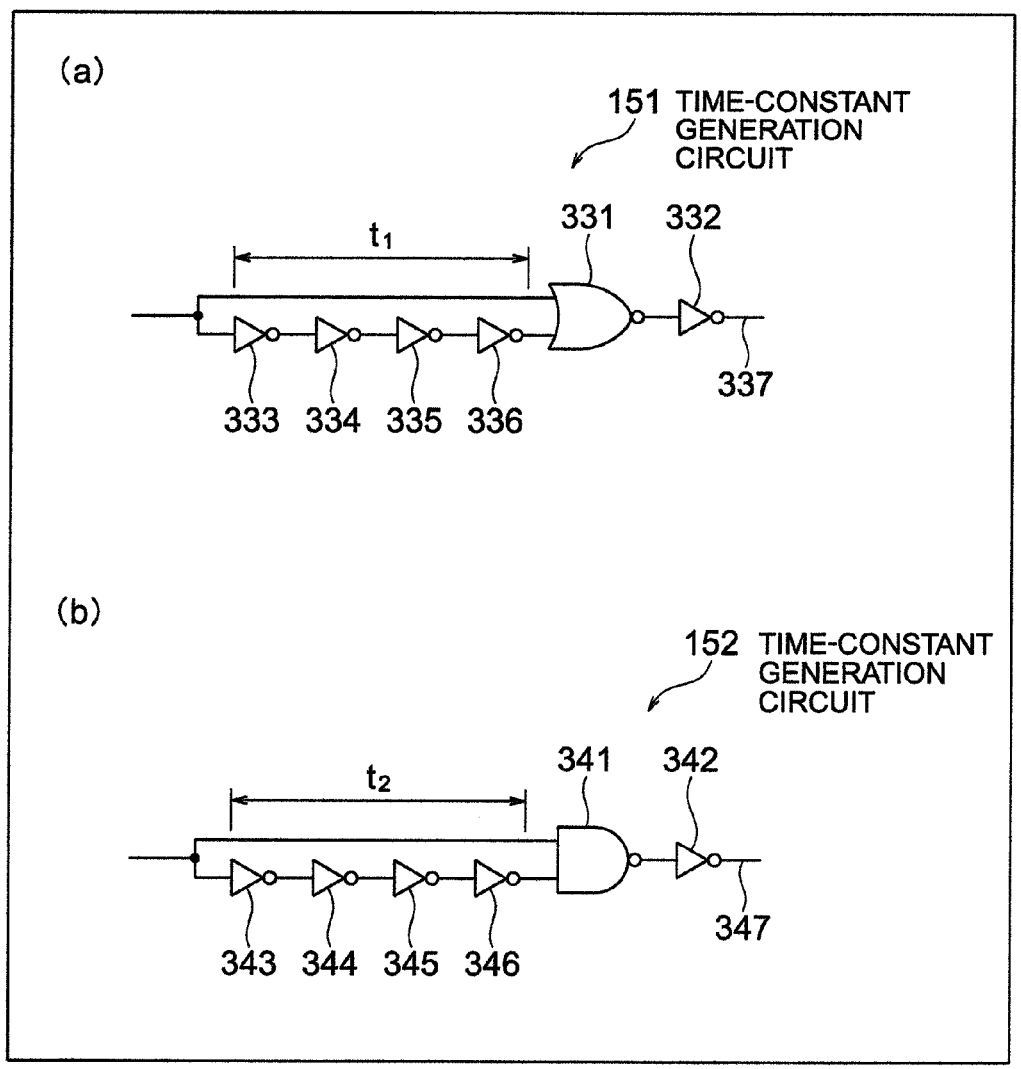
FIG. 11 is a circuit drawing representing other configuration examples of a time-constant generation circuit to be used in the level shift circuit of the present invention.

Furthermore, in FIG. 1 and FIG. 8, the circuit of FIG. 3, (a) was represented as the time-constant generation circuit 151 (153). Here, the resistance 313 and the capacitor 314 were used as elements to generate the delay time, however, the circuit represented in FIG. 11(a) may be used. FIG. 11, (a) is one where inverter circuits 333, 334, 335 and 336 are connected in four stages in series. By the delays of these inverter circuits 333, 334, 335 and 336, the delay time $t_1$ is generated.

It should be noted that the series stage number of the inverter circuits may be composed without limiting to four stages as long as it is an even number.

In addition, these inverter circuits 333, 334, 335 and 336 are those for setting the delay time. Therefore, the delay time may be set large by making the channel length of the MOSFET longer than other one so as to decrease the drive capability.

In addition, inverter circuits comprised of even number stages in series and a CR circuit with the resistance and the capacitor may be combined.

In addition, in FIG. 1 and FIG. 8, the circuit of FIG. 3, (b) was represented as the time-constant generation circuit 152 (154). Here, the resistance 323 and the capacitor 324 were used as elements to generate the delay time, however, the circuit represented in FIG. 11, (b) may be used. FIG. 11, (b) is one where inverter circuits 343, 344, 345 and 346 are connected in four stages in series. By the delay of these inverter circuits 343, 344, 345 and 346, the delay time $t_2$ is generated.

It should be noted that the series stage number of the inverter circuits may be composed without limiting to four stages as long as it is an even number.

In addition, these inverter circuits 343, 344, 345 and 346 are those for setting the delay time. Therefore, the delay time may be set large by making the channel length of the MOSFET longer than other one so as to decrease the drive capability.

In addition, inverter circuits of even number stages in series and a CR circuit with the resistance and the capacitor may be combined.

In addition, the first and the second logic circuits 121 and 122 in FIG. 1, or the first and the second logic circuit 621 and 622 in FIG. 6, are configured with using the NAND circuit 123 (124) and the inverter circuit 125 (126, 623, 624, 625, 626), however, the same function may be configured by other circuits as well.

Figure 12:
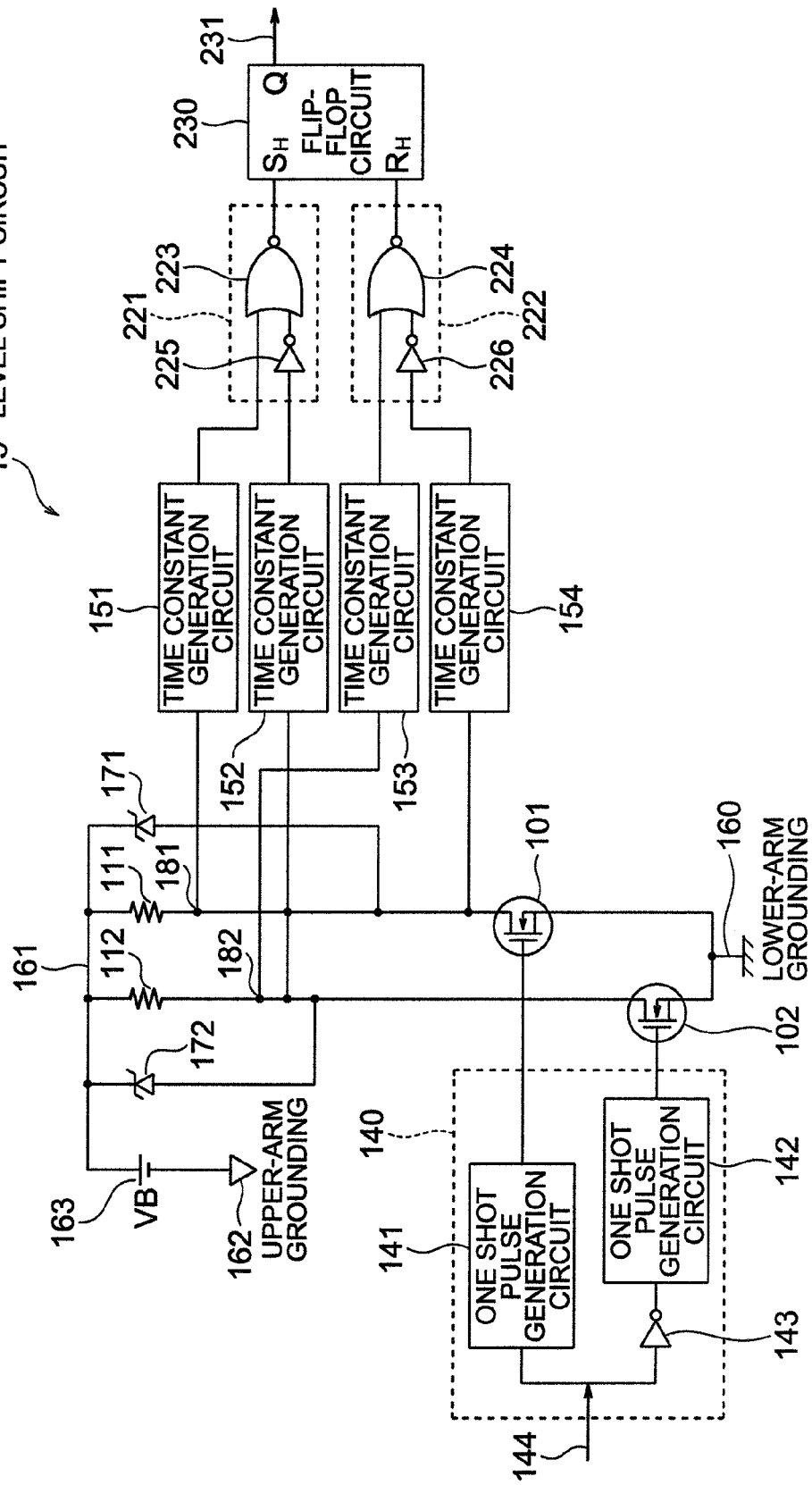
FIG. 12 is a circuit drawing representing a configuration of a fifth embodiment of a level shift circuit of the present invention.

FIG. 12 is one where the first and the second logic circuits 121 and 122, and the flip-flop circuit 130 were replaced with other circuits, in the level shift circuit 11 of FIG. 1. In FIG. 12, a first logic circuit 221 is comprised of a NOR circuit 223 and an inverter circuit 225. A first input gate of the NOR circuit 223 is the first input terminal of the first logic circuit 221. An input terminal of the inverter circuit 225 is the second input terminal of the first logic circuit 221. An output terminal of the inverter circuit 225 is inputted to a second input terminal of the NOR circuit 223. An output terminal of the NOR circuit 223 is the output terminal of the first logic circuit 221.

In addition, a second logic circuit 222 is comprised of a NOR circuit 224 and an inverter circuit 226. A first input gate of the NOR circuit 224 is the first input terminal of the second logic circuit 222. An input terminal of the inverter circuit 226 is the second input terminal of the second logic circuit 222. An output terminal of the inverter circuit 226 is inputted to a second input terminal of the NOR circuit 224. An output terminal of the NOR circuit 224 is an output terminal of the second logic circuit 222.

An output terminal of the first logic circuit 221 is connected to a set terminal $S_L$ of a flip-flop circuit 230. The output terminal of the second logic circuit 222 is connected to a reset terminal $R_L$, of the flip-flop circuit 230.

In this way, the first and the second logic circuits may be comprised of various circuits. However, the output of the first logic circuit 221 and the second logic circuit 222 of FIG. 12 is configured so as to operate by a signal of "H".

Therefore, the set terminal $S_H$ and the reset terminal $R_H$ of the flip-flop circuit 230 both operate by the signal of "H". A circuit configuration example of FIG. 13 is represented as a circuit where the set terminal $S_H$ and the reset terminal $R_H$ operate by the signal of "H".

Figure 13:
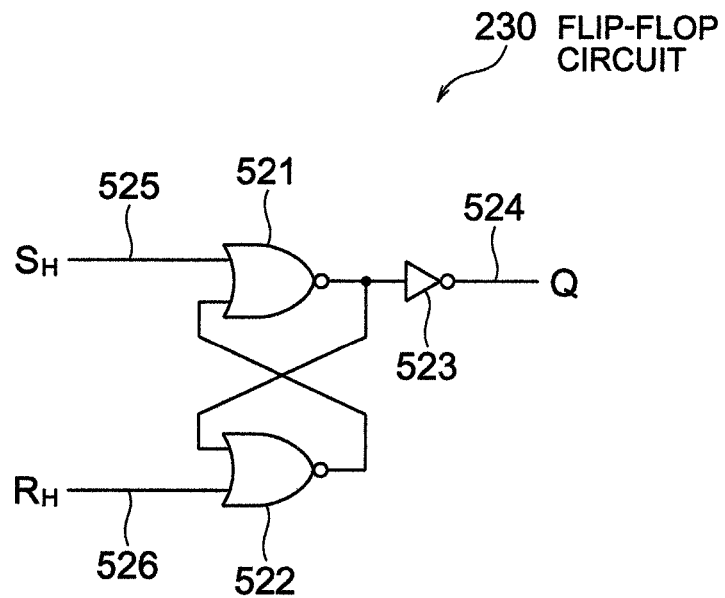
FIG. 13 is a circuit drawing representing other configuration example of a flip-flop circuit to be used in the level shift circuit of the present invention.

In FIG. 13, the output terminal of a NOR circuit 521 is connected to the first input gate of a NOR circuit 522. The output terminal of the NOR circuit 521 is connected to the second input gate of the NOR circuit 521. The first input gate of the NOR circuit 521 is a set terminal $(S_L)$ 525 as the RS-type flip-flop circuit. The second input gate of the NOR circuit 522 is a reset terminal $(R_L)$ 526 as the RS-type flip-flop circuit. The output terminal of the NOR circuit 521 is connected to the input terminal of an inverter circuit 523, and the output terminal of the inverter circuit 523 is an output terminal (Q) 524 of the flip-flop circuit 230. It should be noted that the set terminal $(S_H)$ 525 and the reset terminal $(R_H)$ 526 operate by the signal of "H". Therefore, reference signs of the set terminal $(S_H)$ 525 and the reset terminal $(R_H)$ 526 are represented by a subscript H.

In this way, the flip-flop circuit may also be configured variously.

In addition, in FIG. 10, the fourth embodiment of the level shift circuit 14 using the filter circuits 191 and 192 were represented, however, a method for using such filter circuits 191 and 192 is possible in other embodiments. That is, in each of the embodiments of FIG. 1, FIG. 6, FIG. 8 and FIG. 12, by further providing the filter circuits 191 and 192, the output of the first and the second logic circuits may be connected to the set terminal and the reset terminal of the flip-flop circuit, by passing through the filter circuits 191 and 192, respectively.

In addition, the case where the circuit was comprised of MOSFETs in the above example, however, it is not limited to the MOSFETs as long as the above-described circuit can be configured. For example, it may be configured by bipolar transistors or BiCMOS.

It should be noted that, in FIG. 1, FIG. 6, FIG. 8, FIG. 10 and FIG. 12, the case was represented where the Zener diodes 171 and 172 were installed aiming at protecting elements by which the level shift circuits 11, 12, 13, 14 and 15 are configured, however, these Zener diodes 171 and 172 are not essential elements.

(Embodiment of a Power Conversion Unit)

Description will be given next on an embodiment of a power conversion unit having the above level shift circuit.

Figure 14:
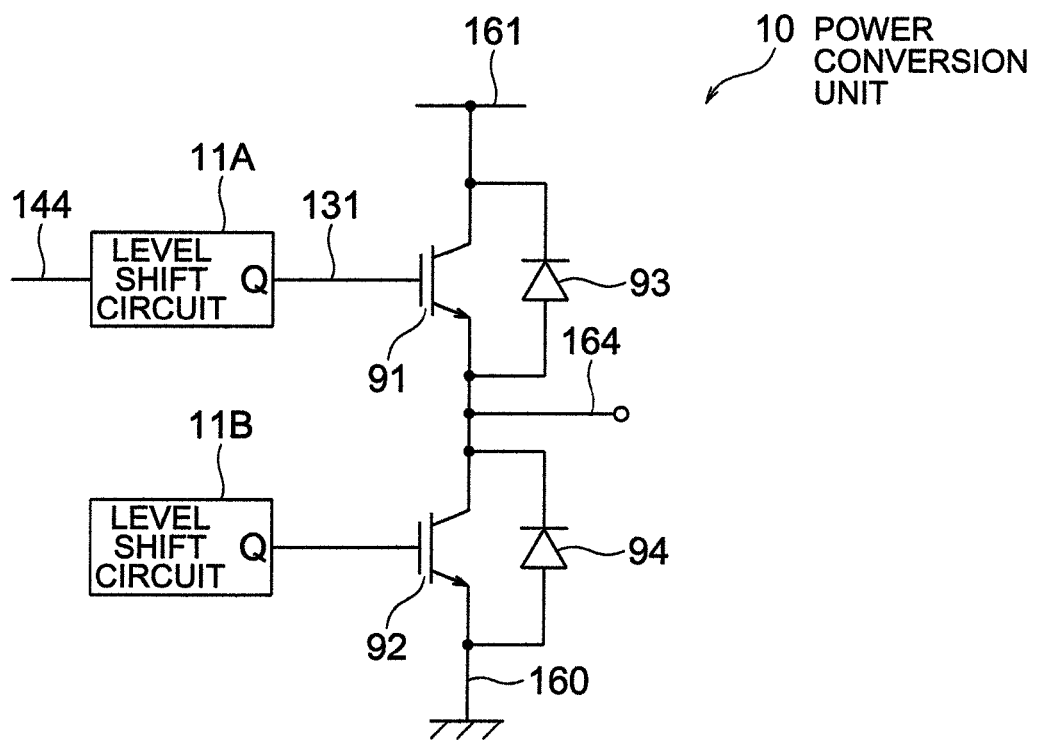
FIG. 14 is a circuit drawing representing a configuration of the power conversion unit of the present invention.
Figure 15:
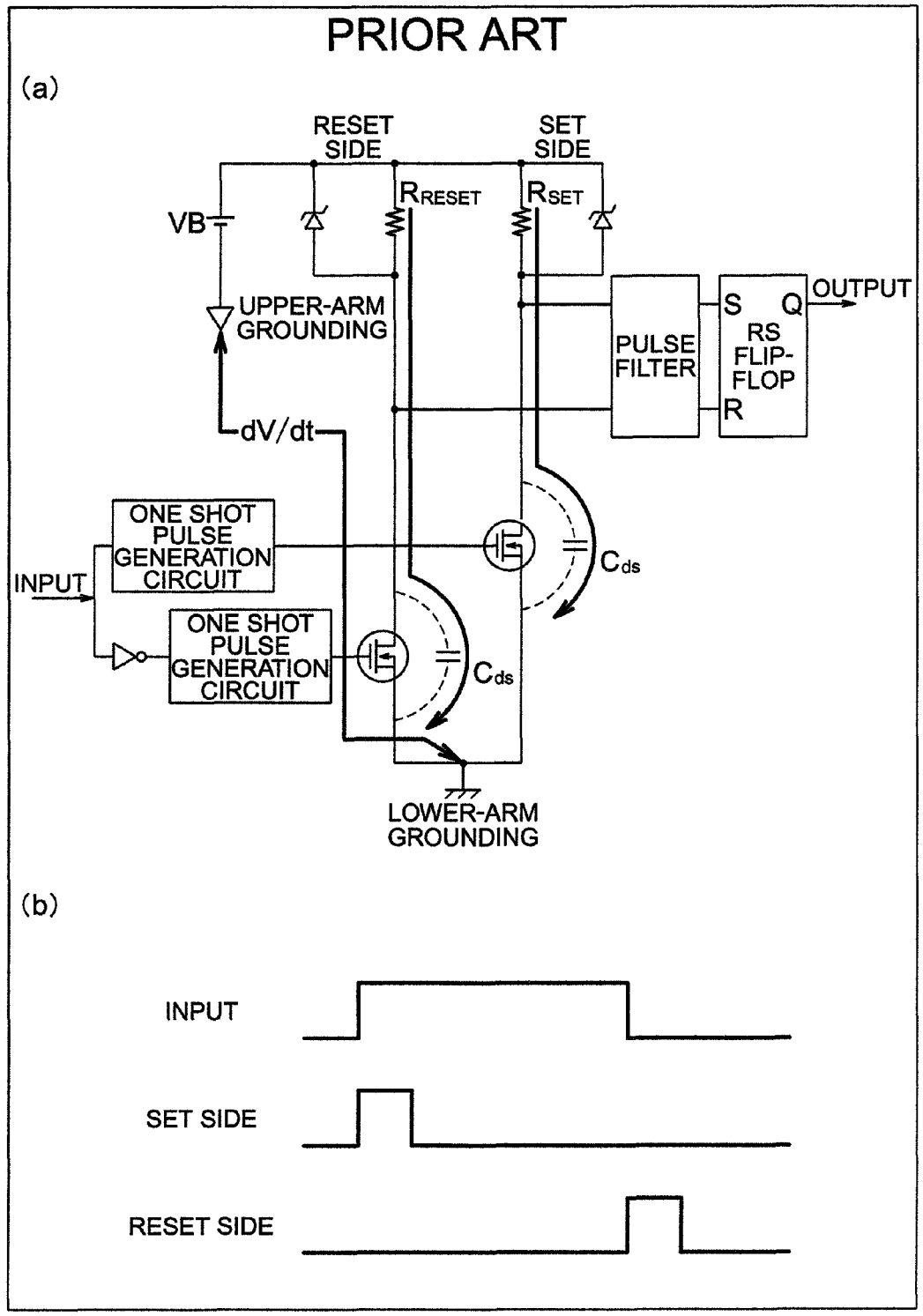
FIG. 15 is a circuit drawing (*a*) representing a first configuration example of a conventional level shift circuit, and a time chart (*b*) of a signal.
Figure 16:
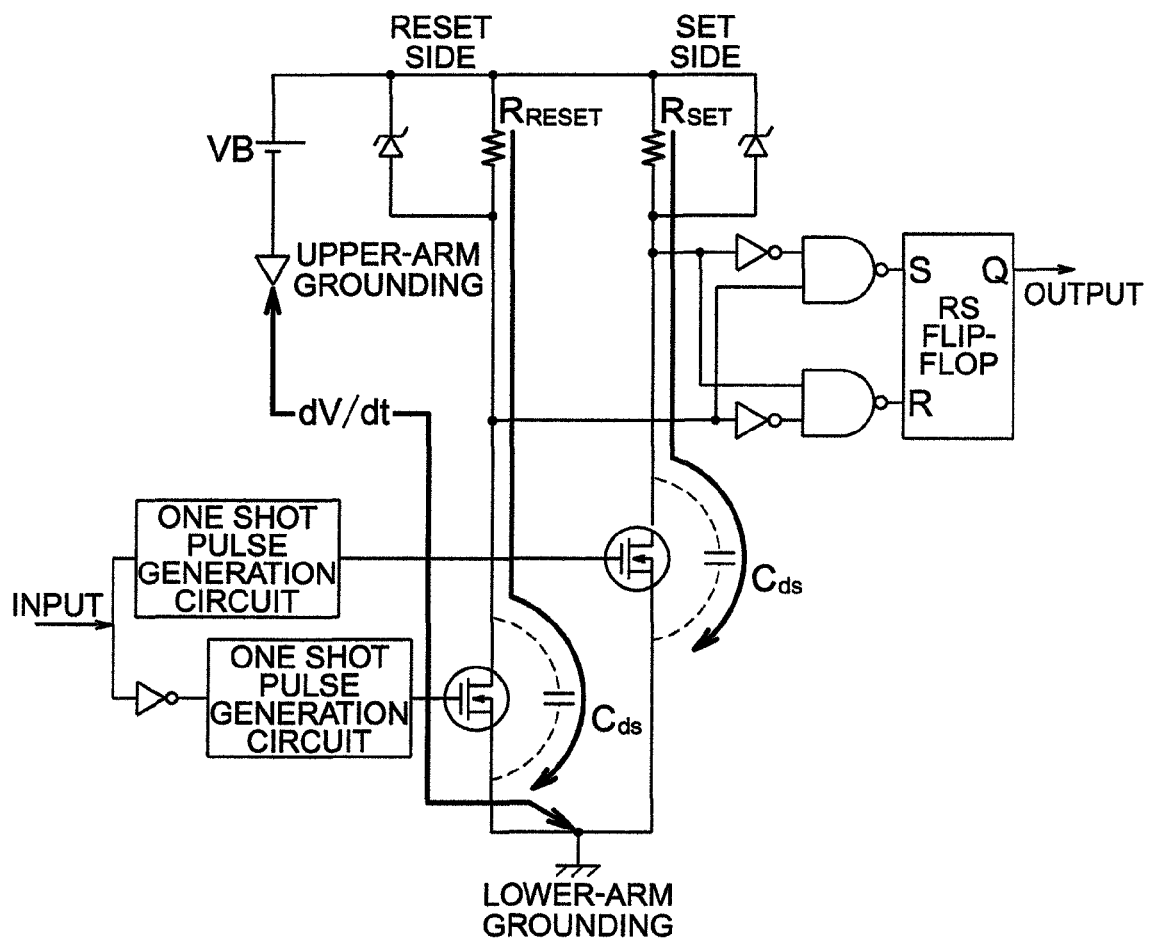
FIG. 16 is a circuit drawing representing a second configuration example of the conventional level shift circuit.

FIG. 14 represents a circuit configuring a power conversion unit 10 using the above level shift circuit 11 (FIG. 1). An emitter terminal of an IGBT 92 is connected to a lower-arm grounding 160; a collector terminal of the IGBT 92 is connected to an emitter terminal of an IGBT 91; and a collector terminal of the IGBT 91 is connected to a high-voltage terminal 161 of a high-voltage direct-current power source. A gate input terminal of the IGBT 92 is connected to an output terminal of a level shift circuit 11B. A gate input terminal of the IGBT 91 is connected to an output terminal of the level shift circuit 11A. A connection point 164 of the collector terminal of the IGBT 92 and the emitter terminal of the IGBT 91 is the output terminal of the power conversion unit 10. In addition, Zener diodes 93 and 94 are connected to the emitter terminal and the collector terminal of the IGBT 91 and 92, respectively.

A signal of the lower voltage side circuit is inputted to an input terminal 144 of the level shift circuit 11A, converted to a signal of the higher voltage side circuit, and outputted from an output terminal 131 of the level shift circuit 11A. By this signal of the higher voltage side circuit, the IGBT 91 is driven. In addition, a signal of other lower voltage side circuit is converted to the signal of the higher voltage side circuit by the level shift circuit 11B, and the IGBT 92 is drive. By the IGBTs 91 and 92, a power converted output is obtained at the output terminal 164 of the power conversion unit 10.

(Other Embodiment of the Power Conversion Unit)

As described above, in FIG. 14, the power conversion unit with the IGBT 91 and the IGBT 92 forming a pair of arms was shown, however, a three-phase power conversion unit can also be configured if six IGBTs forming three pair of arms and six level shift circuits are used.

Further, in FIG. 14, an example was represented where the output terminals of the level shift circuits 11a and 11B are directly connected to the gate input terminals of the IGBTs 91 and 92, respectively, however, a circuit having function of a buffer circuit or a cushion circuit may be inserted between the output terminals of the level shift circuits 11A and 11B, and the gate input terminals of the IGBTs 91 and 92, to protect the circuit or adjust the drive ability.

In addition, in FIG. 14, an embodiment was represented where the power conversion unit is configured by using the level shift circuit 11 represented in FIG. 1, however, the level shift circuit is not limited to the circuit of FIG. 1. It may be the level shift circuits represented in FIG. 6, FIG. 8, FIG. 10 and FIG. 12.

As described above, according to the present invention, when the power source voltage variation dV/dt of the high voltage side occurs in the level shift circuit in such a degree as provide an influence on the logic level of the circuit, the passing through of the malfunction signal is masked and prevented in the first and second logic circuits by a signal from the time-constant generation circuit or a portion where the power voltage variation occurs in advance, by utilizing the fact that this variation occurs both at the set side and the reset side.

By taking sufficient allowance in the timing of this masking, even if there is a production variation in each element in the semiconductor process, it can be prevented for the erroneous signal to be transmitted to the flip-flop when the power source voltage variation dV/dt is generated at the high voltage side. In this way, the present invention can provide the level shift circuit that does not easily give a malfunction even for the power source voltage variation, with low consumption power and is resistant to the production variation.

In addition, the present invention can provide the power conversion unit using said level shift circuit.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A level shift circuit for transmitting a control signal from a low voltage side circuit having a low-voltage direct-current power source as a power source to a high voltage side circuit having a high-voltage direct-current power source as a power source, comprising:

a one-shot pulse generator for generating a set signal pulse and a reset signal pulse at a rise of and at a fall of an input signal, respectively, with the low-voltage direct-current power source as the power source;

a first semiconductor switching element wherein the first terminal is connected to a low voltage terminal of the high-voltage direct-current power source and the set signal pulse is inputted;

a second semiconductor switching element wherein the first terminal is connected to the low voltage terminal of the high-voltage direct-current power source and the reset signal pulse is inputted;

a first resistance one end of which is connected to a high voltage terminal of the high-voltage direct-current power source;

a second resistance one end of which is connected to a high voltage terminal of the high-voltage direct-current power source;

a third resistance connected between other end of the first resistance and a second terminal of the first semiconductor switching element;

a fourth resistance connected between other end of the second resistance and a second terminal of the second semiconductor switching element;

a first time-constant generation circuit wherein a connection point of the first resistance and the third resistance is connected to an input terminal;

a second time-constant generation circuit wherein a connection point of the second terminal of the second semiconductor switching element and the fourth resistance is connected to an input terminal;

a third time-constant generation circuit wherein a connection point of the second resistance and the fourth resistance is connected to an input terminal;

a fourth time-constant generation circuit wherein a connection point of the second terminal of the first semiconductor switching element and the third resistance is connected to an input terminal;

a first logic circuit wherein an output terminal of the first time-constant generation circuit and an output terminal of the second time-constant generation circuit are connected to a first input terminal and a second input terminal, respectively, using the high-voltage direct-current power source as a power source, and a set signal is output;

a second logic circuit wherein an output terminal of the third time-constant generation circuit and an output terminal of the fourth time-constant generation circuit are connected to a first input terminal and a second input terminal, respectively, using the high-voltage direct-current power source as a power source, and a reset signal is output; and a flip-flop circuit wherein the set signal from an output terminal of the first logic circuit and the reset signal from an output terminal of the second logic circuit are inputted, respectively, using the high-voltage direct-current power source as the power source, and a drive signal is output.

2. The level shift circuit according to claim 1, further comprising:
a first filter circuit; and
a second filter circuit;
wherein an output of the first logic circuit is connected to an input of the first filter circuit, an output of the second logic circuit is connected to an input of the second filter circuit, and each of an output of the first filter circuit and an output of the second filter circuit is inputted to the flip-flop circuit.

3. The level shift circuit according to claim 1, wherein the first, second, third and fourth time-constant generation circuits have different time-constants at a rise of and at a fall of each input signal.

4. The level shift circuit according to claim 3, wherein the first time-constant generation circuit has a larger time-constant at the fall of the input signal and a smaller time-constant at the rise of the input signal, as compared with the second time-constant generation circuit, and the third time-constant generation circuit has a larger time-constant at the fall of the input signal and a smaller time-constant at the rise of the input signal, as compared with the fourth time-constant generation circuit.

5. The level shift circuit according to claim 3, wherein a resistance means and a capacitance means for determining the time-constant are each provided in the first, second, third and fourth time-constant generation circuits.

6. The level shift circuit according to claim 3, wherein a non-disjunction circuit is provided in the first and third time-constant generation circuits, and a non-conjunction circuit is provided in the second and fourth time-constant generation circuits.

7. The level shift circuit according to claim 1, wherein the first and second semiconductor switching elements are semiconductor elements where a substrate forming said semiconductor switching element is separated and independent from other circuits.

8. The level shift circuit according to claim 1, wherein the first and second semiconductor switching elements are MOSFETs, the first terminal of the semiconductor switching element is a source of the MOSFET, and the second terminal of the semiconductor switching element is a drain of the MOSFET.

9. A power conversion unit comprising a level shift circuit, further comprising:
an IGBT constituting an arm;
wherein said IGBT is driven by the level shift circuit according to claim 1.

* * * * *